(12) United States Patent
Funaba et al.

(10) Patent No.: US 7,102,905 B2
(45) Date of Patent: Sep. 5, 2006

(54) STACKED MEMORY, MEMORY MODULE AND MEMORY SYSTEM

(75) Inventors: Seiji Funaba, Chuo-ku (JP); Yoji Nishio, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 7 days.

(21) Appl. No.: 10/979,157

(22) Filed: Nov. 3, 2004

(65) Prior Publication Data
US 2005/0099834 A1    May 12, 2005

(30) Foreign Application Priority Data
Nov. 6, 2003    (JP) .............................. 2003-376852

(51) Int. Cl.
*G11C 5/02*    (2006.01)
*G11C 7/00*    (2006.01)

(52) U.S. Cl. ..................... 365/51; 257/777; 257/686

(58) Field of Classification Search .................. 365/51; 257/777, 686
See application file for complete search history.

(56) References Cited

U.S. PATENT DOCUMENTS

| 6,262,488 B1* | 7/2001 | Masayuki et al. .......... 257/777 |
| 6,566,760 B1* | 5/2003 | Kawamura et al. ......... 257/777 |
| 6,713,854 B1* | 3/2004 | Kledzik et al. ............. 257/686 |

FOREIGN PATENT DOCUMENTS

| JP | H06-291250 A | 10/1994 |
| JP | H07-202120 A | 8/1995 |
| JP | H10-301888 A | 11/1998 |
| JP | 2001-027987 A | 1/2001 |

* cited by examiner

*Primary Examiner*—Son T. Dinh
*Assistant Examiner*—N Nguyen
(74) *Attorney, Agent, or Firm*—Sughrue Mion, PLLC

(57) ABSTRACT

A point-to-point bus and a daisy chain bus are provided for supplying signals to stacked memories, and the stacked memories are mounted mutually apart by a distance equivalent to the length of the stacked memory on both surfaces of a module substrate. Furthermore, the memory chips arranged in a stacked memory mounted on one surface are set in an active state at the same time alternately with the memory chips arranged in a stacked memory mounted on another surface of the module substrate.

27 Claims, 20 Drawing Sheets

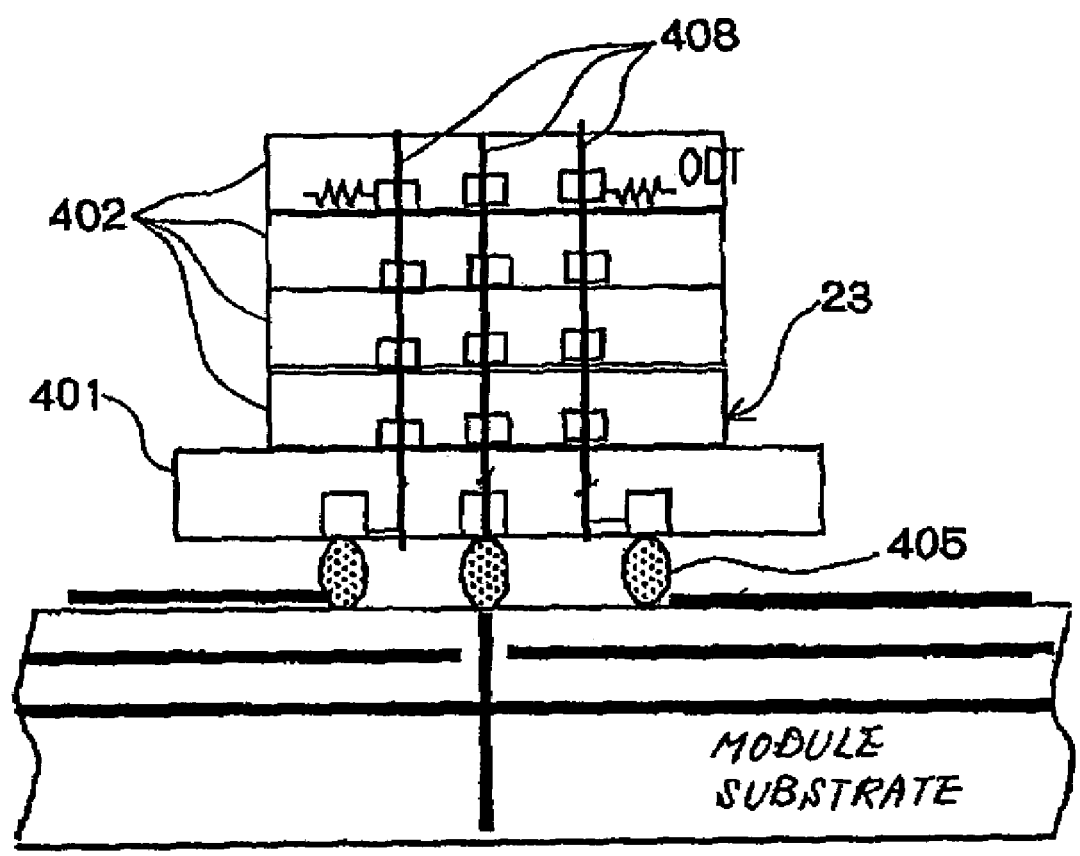
F I G. 1 1

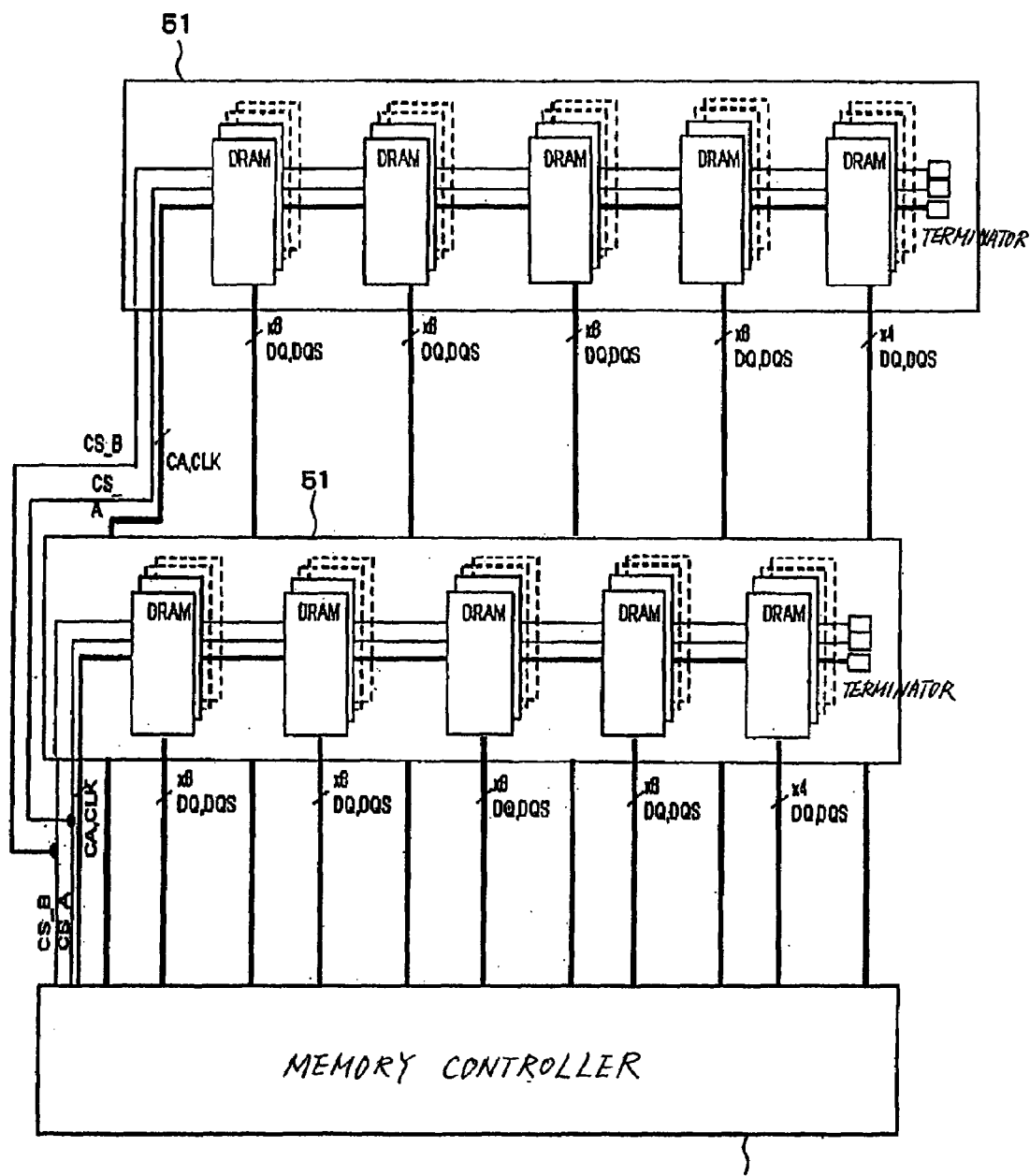
F I G. 19

STACKED MEMORY, MEMORY MODULE AND MEMORY SYSTEM

BACKGROUND OF THE INVENTION

1. Field of Invention

The present invention relates to a stacked memory having a plurality of built-in memory chips, a memory module mounted with a plurality of stacked memories and a memory system having the memory module.

2. Description of the Related Art

An access time of a memory such as a DRAM has recently been sped up and with this, memory systems making use of a point-to-point bus and a daisy chain bus have come to be an object for consideration in order to ensure the waveform quality of signals transmitted at high speeds (cf., for example, RAMBUS Co. U.S.A., Yellowstone Memory System: Rich Warmke, "Yellowstone, A Next Generation memory Signaling Technology" RAMBUS DEVELOPER FORUM, OCT. 29, 2002, [Oct. 30, 2003, retrieved] internet <URL: http:rambus.com/rdf/rdf2002/pdf/rdf_consumer_track.pdf.>)

More specifically, memory modules have been envisioned which use multibit point-to-point buses to transmit DQ (data) signals and DQS (DQ strobe) signals while using daisy chain buses to transmit control signals such as CA (command address) signals, CLK (clock) signals and CS (chip select) signals.

Presently, a single-rank memory configuration and a double-rank memory configuration are known with regard to a 64-bit I/O memory module. The single-rank memory configuration has eight 4-bit I/O (data width) memories mounted on each of the front and reverse surfaces of the module substrate, i.e., a total of sixteen memories, and activates all memories at the same time. The double-rank memory configuration has eight 8-bit I/O (data width) memories mounted on each of the front and reverse surfaces of the module substrate, i.e., a total of sixteen memories. In this memory configuration, memories mounted on each of the front and reverse surfaces of the module substrate share a DQ signal wiring of 8-bit width, and eight memories on either a front surface or a reverse surface are activated at the same time.

FIGS. 1A and 1B represent a conventional memory module of a 64-bit I/O, double-rank configuration.

Memory module 101 shown in FIGS. 1A and 1B has a structure in which eight memories (DRAMS) are mounted on each of the front and reverse surfaces of module substrate 102, totaling sixteen memories. Each memory 103 is of an 8-bit I/O type, and two memories 103 arranged in opposed positions on the front and reversed surfaces of module substrate 102 share an 8-bit DQ signal wiring.

A point-to-point bus is employed for a DQ signal wiring of memory module 101 illustrated in FIGS. 1A, 1B making point-to-point connections between memory controller 104 and respective memories 103 (DRAM) in memory module 101. The point-to-point bus is terminated by an ODT (On Die Terminator) provided in each memory 103, whereby the reflections of the DQ signal and DQS signal transmitted through the point-to-point bus are prevented.

Further, daisy chain buses are employed for CA and CLK signal wirings and the CS signal wirings to select memories to be activated, wherein the CA and CLK signal wirings are shared by all the memories 103 of memory modules 101 with the ends of the wirings terminated with terminators. For reference, each of the CS signal wirings is shared exclusively by the group of the memories prescribed to be activated at the same time (rank). Memories 103 mounted on memory module 101 shown FIGS. 1A and 1B are divided into two groups (ranks) each made up of eight memories 103 arranged on the front and reverse surfaces, respectively, of module substrate 102. In this double-rank configuration of memory module 101, a bank of eight memories 103 is made active at the same time (for example, memories shaded with slant lines in FIG. 1B).

Nevertheless, a problem has been known concerning a memory module that the speed-up of memory access generally entails an increase in power consumption, which in turn causes the temperature of a package to be raised and consequently the performance of a memory to be degraded.

In the above-described memory modules of single- and double-rank configurations, the double-rank configuration needs smaller power consumption than the single-rank configuration on account of the number of memories set in an active state at the same time, thereby enabling a temperature rise to be suppressed. For this reason, it might be preferred to configure a memory module such that the number of memories set in the active state at the same time is further decreased in order to further reduce the power consumption of the memory module. For example, a four-rank configuration can be intended in which eight 16-bit I/O memories are mounted on each of the front and reverse surfaces of the module substrate totaling sixteen memories and each of banks of four neighboring memories, arranged in opposite positions on the front and reverse surface of the module substrate, shares a 16-bit DQ signal wiring and is set in an active state at the same time.

FIGS. 2A and 2B illustrate a conventional 64-bit I/O memory module in a four-rank configuration through the use of ordinary memories.

Memory module 201 represented in FIGS. 2A and 2B is configured such that eight memories are mounted on each of the front and reverse surfaces of module substrate 202 totaling sixteen memories (DRAM) 203, just like memory module 101 shown in FIGS. 1A and 1B.

Memory module 201 has a configuration such that memories 203 are of a 16-bit I/O each, and arranged in opposed positions on the front and reverse surfaces of module substrate 202 and further, four neighboring memories 203 share a 16-bit DQ signal wiring.

Point-to-point buses are employed for DQ signal wirings of memory module 201 shown in FIGS. 2A and 2B, just like memory module 201 shown in FIGS. 1A and 2B and a memory controller (not shown) and each of memories 203 mounted on module substrate 202 are connected through the point-to-point connection. An ODT (On Die Terminator), provided in each of memories 203, terminates the point-to-point bus to prevent reflections of the DQ and DQS signals transmitted by the point-to-point bus.

Further, daisy chain buses are employed for CA, CLK signal wirings and CS signal wirings, as is the case with memory module 101 shown in FIGS. 1A and 1B, with the CA, CLK signal wirings being shared by all the memories 203 in memory module 201 and the wiring ends thereof terminated by terminators. In addition, each CS signal wiring is shared exclusively by the group (rank) of memories 203 to be set in an active state at the same time.

Memories 203 to be mounted on memory module 101 shown in FIGS. 2A and 2B are arranged in opposed positions on the front and reverse surfaces of module substrate 202, and divided into four groups of four neighboring memories each, wherein in this memory module 201 in four-rank configuration, four memories 203 are activated at the same time (memories shaded with slant lines in FIG. 2A). Consequently, the power consumption is decreased as compared with memory module 101 of double-rank configuration as shown in FIGS. 1A and 1B.

In the four-rank memory module shown in FIGS. 2A and 2B, each of the banks of four neighboring memories each arranged in opposed positions on the front and reverse surfaces of a module substrate shares sixteen DQ signal wirings. As a result, it is required to arrange eight DQ signal wirings between two memories mounted on the front and reverse surfaces across the module substrate and further to branch the wirings into two directions to connect the branched wirings to the neighboring memories.

However, memories are mounted on a module substrate nearly too closely to leave any room so that distances between wirings are short and also limitations are imposed on the wiring directions of the DQ signal wirings for memories. Consequently, the degree of wiring freedom of the DQ signal wiring markedly drops down, the wiring lengths connecting to two memories become asymmetric and significantly fluctuate, and cross-talk noise and ISI (intersignal interference) noise increase. Furthermore, the fluctuations in the arrival timings of signals increase, the qualities of waveforms of the DQ signals are degraded causing difficulty in a high-speed transmission through a bus.

In addition, it is required to receive CA and CS signals in the same timing, because in a memory module, these signals are processed in the same way. For this reason, it is desired to coordinate the transmission characteristics of the CA signal wiring and the CS signal wiring not to make a difference in the transmission speeds of the CS signal and the CA signal.

SUMMARY OF THE INVENTION

It is an object of the present invention to provide a memory module of a four-rank configuration that allows a high speed data transmission without degrading a signal quality and also allows coordinating the transmission characteristics of signal wirings of a variety of control signals, and further that is advantageous for realizing low power consumption.

In order to attain the above-described object, the stacked memory of the present invention is configured to comprise a package substrate having signal terminals arranged near the periphery thereof, and a plurality of memory chips that are mounted on both surfaces of the package substrate and share the signal terminals.

In the above stacked memories, it is not required that neighboring memories share a point-to-point bus (DQ signal wirings) when the stacked memories are employed for a memory module in a four-rank configuration, because a plurality of memory chips built in each stacked memory share a signal terminal. Accordingly, it is avoided to branch the DQ signal wiring or impose a limitation on the DQ signal wiring in the wiring direction.

The memory module according to the present invention, on the other hand, is configured to comprise the above-described stacked memories and a module substrate provided with a point-to-point bus and a daisy chain bus for carrying signals to the stacked memories, wherein the stacked memories are mounted on each of both surfaces of the module substrate spaced apart by a distance equivalent to the length of one stacked memory.

This construction makes it possible to increase the area of the wiring region of the point-to-point bus, reserve the spacing between the DQ signal wirings, and equalize the lengths of the DQ signal wirings, because the stacked memories are arranged on the module substrate spaced apart by a distance equivalent to the length of one stacked memory. Consequently, the cross-talk noise and ISI (Intersignal interference) noise of the DQ signals and the variations in the arrival timings of the signals are suppressed.

Furthermore, because, to the daisy chain bus (the CA and CS signal wirings), there are connected load capacitances each equivalent to a plurality of memory chips (two memory chips) at intervals of one stacked memory, load capacitances to be connected to the signal line are distributed entailing reduction of a local variation in the characteristic impedance of the bus, thereby obviating the degradation of the signal waveform.

Particularly, the performance of the simultaneous selection of the memory chips included in the stacked memories mounted on one surface of the module substrate alternately with the simultaneous selection of the memory chips included in the stacked memories mounted on another surface of the module substrate causes the heat generated in the memory chips to distribute over both surfaces of the memory module, thereby entailing an enhancement of the efficiency of the heat dissipation to mitigate a temperature rise in the memory chip, whereby the degradation of the memory characteristics is suppressed.

The above and other objects, features, and advantages of the present invention will become apparent from the following description with reference to the accompanying drawings which illustrate examples of the present invention.

BRIEF DESCRIPTION OF THE DRAWINGS

FIG. 11 is a cross-sectional side view illustrating the construction of the stacked memory to be mounted on the memory module of a third embodiment according to the present invention;

FIG. 19 is a block diagram illustrating an example of a construction of the memory system according to the present invention;

DETAILED DESCRIPTION OF THE PREFERRED EMBODIMENT

Explanation is next presented regarding the present invention with reference to the drawings.

First Embodiment

A memory module of a first embodiment is configured such that stacked memories are employed for memories to be mounted on a module substrate with two memories (memory chips) sharing signal terminals and the spacing between the stacked memories is widened to allow the degree of freedom in a DQ signal wiring to be ensured.

Figure 3A:
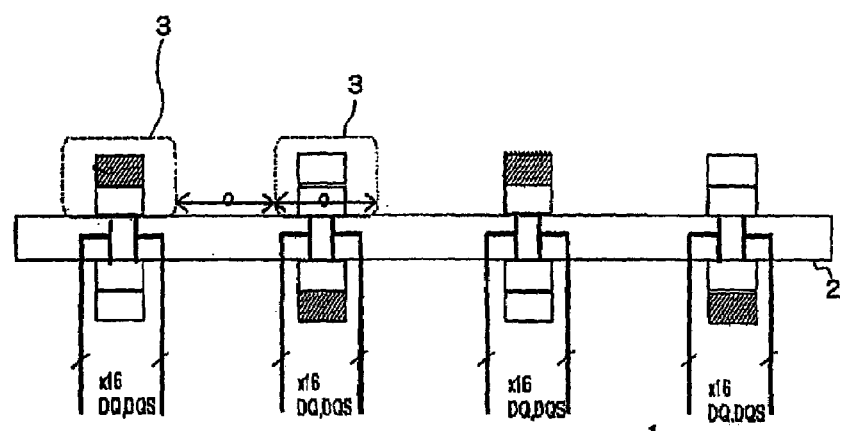
FIG. 3A is a cross-sectional side view illustrating the construction of a first embodiment of the memory module according to the present invention.
Figure 3B:
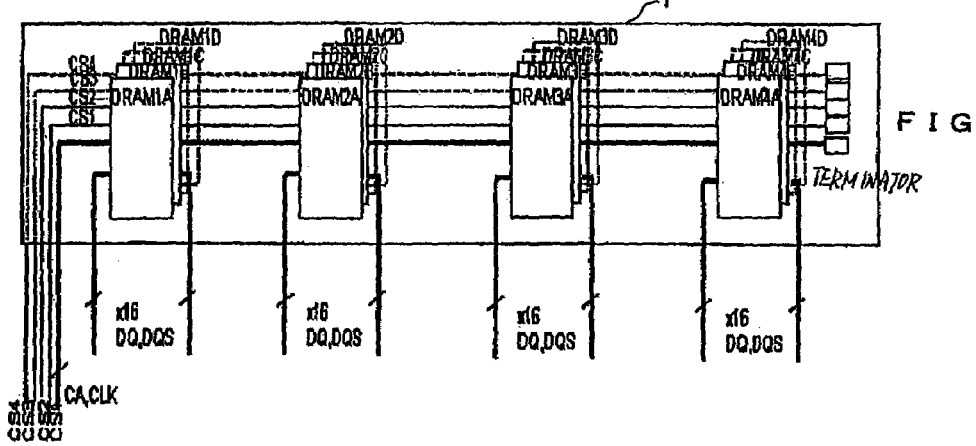
FIG. 3B is a plan view illustrating the construction of a first embodiment of the memory module according to the present invention.

As shown in FIGS. 3A and 3B, memory module 1 of the first embodiment is mounted with sixteen memory chips and configured to have four ranks with 64-bit I/O. Memory module 1 is mounted with a total of eight stack memories 3, four stack memories 3 being mounted on each of the front and reverse surfaces of module substrate 2, wherein each stack memory 3 has a plurality of built-in memory chips (two memory chips in FIGS. 3A, 3B). Accordingly, the number of the memory chips amounts to sixteen. Each stacked memory 3 is provided with 16-bit I/O and each of the two memory chips incorporated in stacked memory 3 is also adapted for 16-bit I/O. The two memory chips built-in each stacked memory 3 share the signal terminals of stacked memory 3.

Further, in memory module 1 of the present embodiment, a 16-bit DQ signal wiring is shared by every stacked memory 3. Furthermore, stacked memories 3 are arranged apart by a length (O) of one stack memory 3.

Figures 1A, 1B:
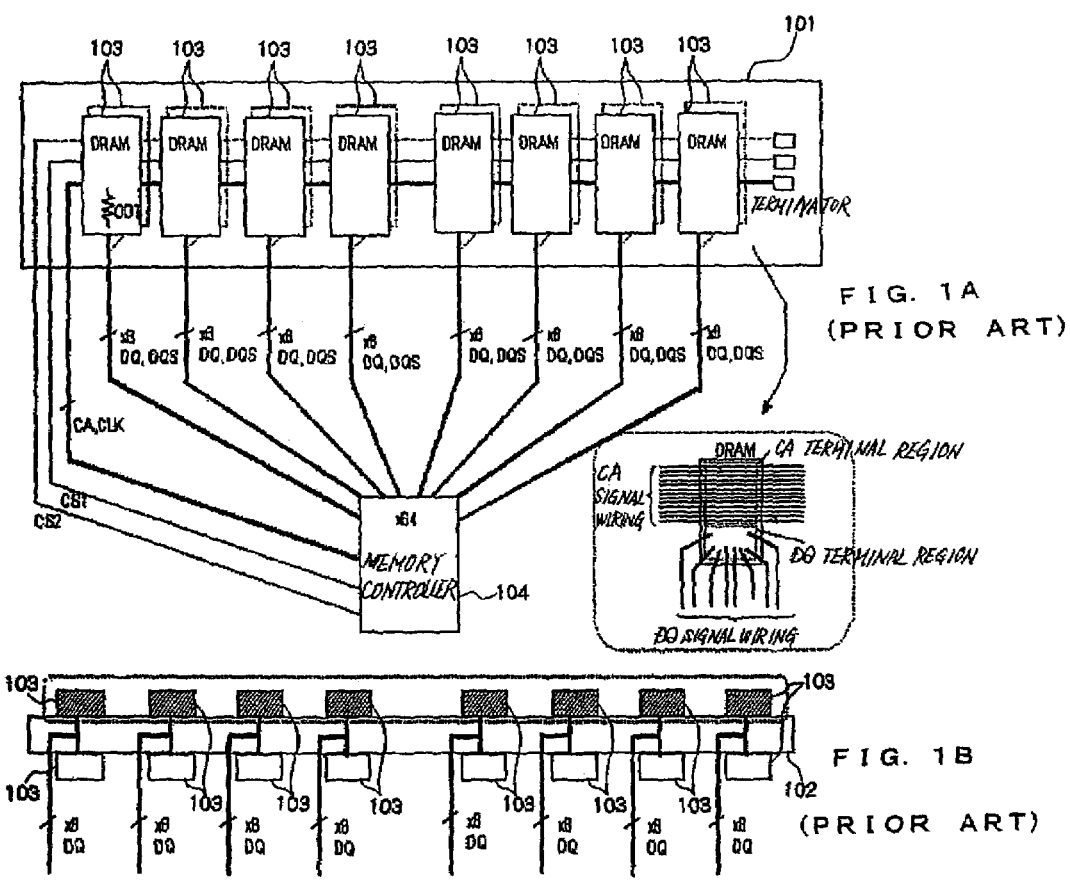
FIG. 1A is a plan view illustrating the construction of a conventional 64-bit I/O, 2-rank configuration memory module.
FIG. 1B is a cross-sectional side view illustrating the construction of a conventional 64-bit I/O, 2-rank configuration memory module.

Point-to-point buses are employed for the DQ signal wirings of memory module 1 just like conventional memory module 101 shown in FIGS. 1A and 1B and the memory controller (not shown) and each stacked memory 3 on module substrate 2 are connected through the point-to-point connection. The point-to-point bus is terminated by an ODT (On Die Terminator) provided in each memory chip, which blocks a reflection of a DQ signal or a DQS signal transmitted through the point-to-point bus.

Further, daisy chain buses are employed for the CLK, CA and CS signal wirings just like conventional memory module 101 shown in FIGS. 1A and 1B, and the CA and CLK signal wirings are shared by all the stacked memories 3 in the memory module 1, the ends of the wirings being terminated. For reference, in the present embodiment, a CS signal wiring (CS1 through CS4) is provided for every group (rank) of memory chips to be set in an active state at the same time.

In the present embodiment, a CA signal is carried through a bus to which the load capacitances each equivalent to four memory chips are connected at intervals of two stacked memories, and a CS signal is carried through a bus to which load capacitances each equivalent to one memory chip are provided at intervals of two stacked memories.

As represented in FIGS. 3A and 3B, four memories are set in an active state at the same time (memories shaded with slant lines in FIG. 3A) in memory module 1 of the present embodiment. Consequently, the power consumption is decreased as compared with the memory module shown in FIGS. 1A and 1B.

Figures 2A, 2B:
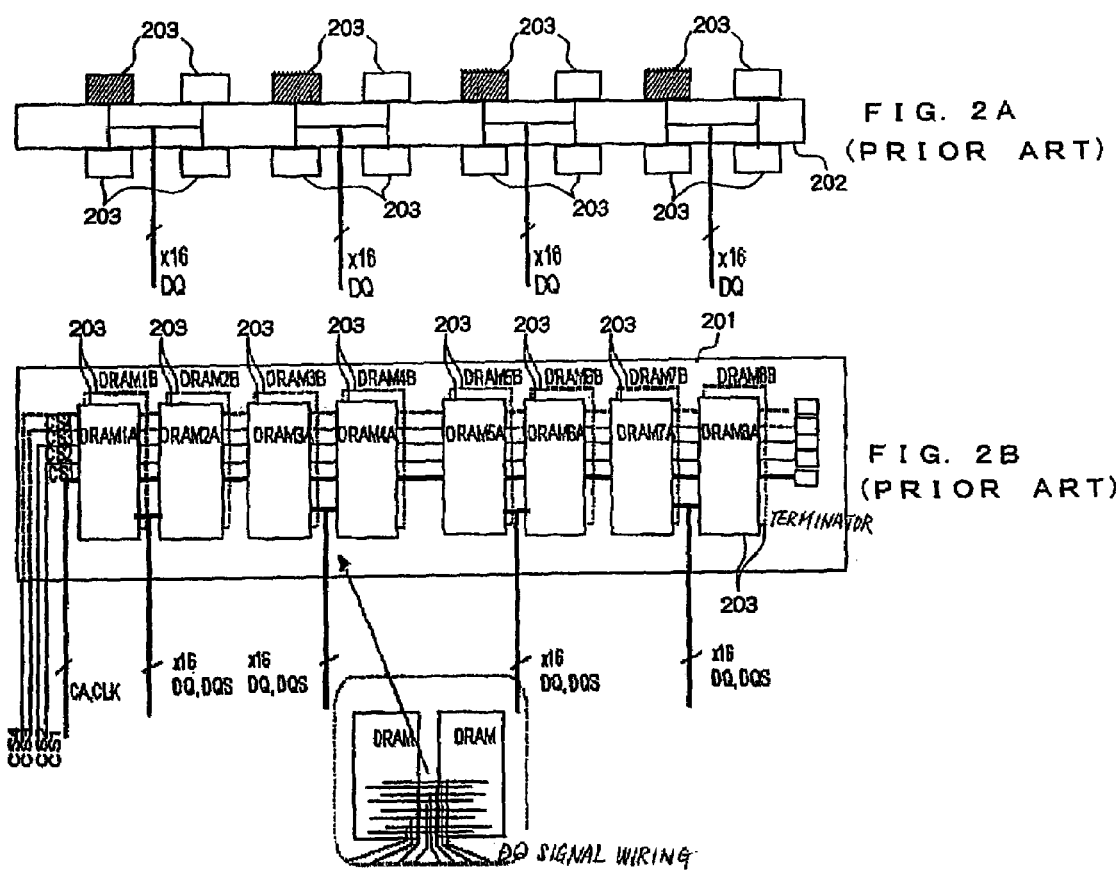
FIG. 2A is a cross-sectional side view illustrating the construction of a conventional 64-bit I/O, 4-rank configuration memory module using ordinary memories.
FIG. 2B is a plan view illustrating the construction of a conventional 64-bit I/O, 4-rank configuration memory module using ordinary memories.

In addition, in memory module 1 of the present embodiment, because neighboring stacked memories share no DQ signal wirings unlike the conventional memory module shown in FIGS. 2A and 2B, branching of a DQ signal wiring in a memory module and the limitations in the wiring directions imposed on stacked memory 3 are avoided. Furthermore, arranging stacked memories 3 apart by a length of one stacked memory provides a larger layout area for DQ signal wirings. Consequently, it becomes feasible to perform wiring with DQ signal wires of an equal length for each of stack memories, thereby enabling suppression of the increase in the cross-talk noise and the ISI (intersignal interference) noise and also the degradation in the quality of a DQ signal waveform due to variations in the signal-arrival timings. For reference, while in FIGS. 3A and 3B, only a part of stacked memories is labeled with symbols for avoiding complication, in the figures that illustrate the configurations of the memory modules in the embodiments describe below, in like wise, only a part of stacked memories will be labeled with symbols.

Figure 4A:
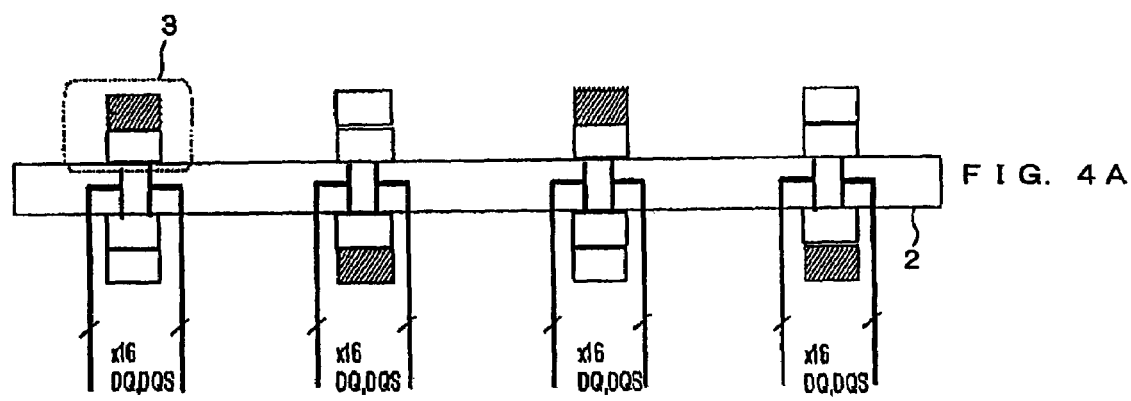
FIG. 4 is a cross-sectional side view illustrating an example of the combination of memory chips to be set in an active state at the same time.
Figure 4B:
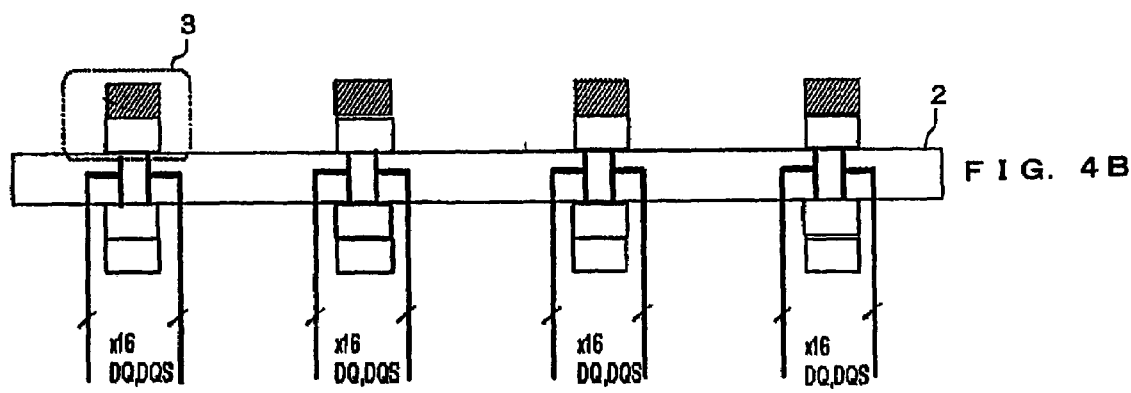

Nevertheless, the memory module shown in FIGS. 3A and 3B can have the configurations shown in FIGS. 4A and 4B as combinations of four memory chips to be set in an active state at the same time: FIG. 4A represents an example in which two memory chips arranged on each of the front and reverse surfaces of module substrate 2 are set in an active state at the same time while the memory chips of neighboring stack memories 3 are not set in an active state at the same time; and FIG. 4B represents an example in which all memory chips to be activated at the same time are designated to those on the same surface of the memory module.

As shown in FIG. 4B, assigning all of the memory chips to be activated at the same time (the memory chips shaded with slant lines in FIG. 4B) to those arranged on the same surfaces of memory module 1 causes the heat generated in respective memory chips to be localized on one of the surfaces of memory module 1, and consequently the efficiency of heat dissipation declines entailing speed-up of the temperature rise in memory chips and possibly degrading the memory characteristics.

For this reason, as shown in FIG. 4A, it is intended that two memory chips arranged on each of the front and reverse surfaces of module substrate 2 are designated as memory chips to be activated at the same time while the memory chips of neighboring stack memories 3 are selected not to be set in an activated state at the same time. In other words, the memory chips included in the stacked memories 3 mounted on one surface of module substrate 2 and the memory chips included in the stacked memories 3 mounted on another surface of module substrate 2 are alternately selected at the same time. Selecting memory chips in this combination allows heat generated in stacked memories 3 to distribute over both of the front and reverse surfaces of module substrate 2, thereby allowing enhancement of the heat dissipation efficiency to cause alleviation of a temperature rise in memory chips and further suppressing the degradation of the memory characteristics. In addition, the combination of the memory chips to be activated at the same time is realized by providing a CS signal wiring (CS 1 through CS 4) common to each group (rank) selected as described above.

Second Embodiment

Figure 5A:
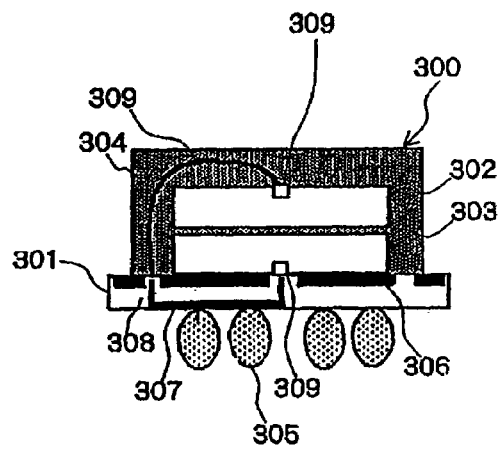
FIG. 5A is a cross-sectional side view illustrating the construction of an ordinary stacked memory.

In the memory module of the first embodiment, if an ordinary stacked memory as shown in FIG. 5A is employed as a stacked memory for mounting on a memory module, a load capacitance equivalent to four memories are connected to the daisy chain bus at prescribed intervals. Consequently, the characteristic impedance of the transmission line locally varies significantly so that a waveform of a signal carried by the daisy chain bus, such as the CA signal, might be deteriorated.

Stacked memory 300 shown in FIG. 5A is configured such that first memory chip 302 is mounted face down (with chip pad 309 directed downward) on package substrate 301 having BGA (BAII Grid Array: a group of ball terminals 305 arranged in an array) on the bottom face and second memory chip 303 is mounted face up (with chip pad 309 directed upward) on first memory chip 302 and fixed with sealing material 304.

Package substrate 301 has, for example, power-supply/GND (ground potential) layer 306 formed on the upper surface and also has signal wiring 307 to be connected to each of ball terminal 305 formed on the bottom surface. First memory chip 302 and signal wiring 307 are connected through via hole 308 provided in package substrate 301, while second memory chip 303 and signal wire 307 are connected through via hole 309 provided in package substrate 301 and bonding wire 309, etc. In addition, in stacked memory 300 shown in FIG. 5A, two built-in memory chips share each ball terminal 305 (signal terminal).

Figure 5B:
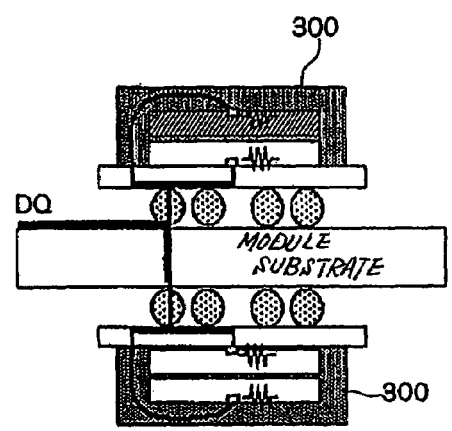
FIG. 5B is a cross-sectional side view illustrating a DQ signal wiring connection between a module substrate and a stacked memory shown in FIG. 5A.
Figure 5C:
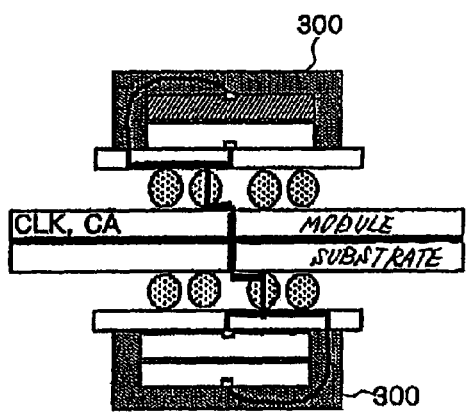
FIG. 5C is a cross-sectional side view illustrating the CLK, CA signal wiring connections between a module substrate and a stacked memory shown in FIG. 5A.
Figure 5D:
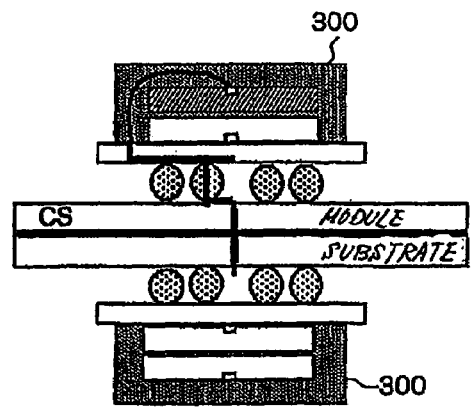
FIG. 5D is a cross-sectional side view illustrating the CS signal wiring connection between a module substrate and a stacked memory shown in FIG. 5A.
Figure 8A:
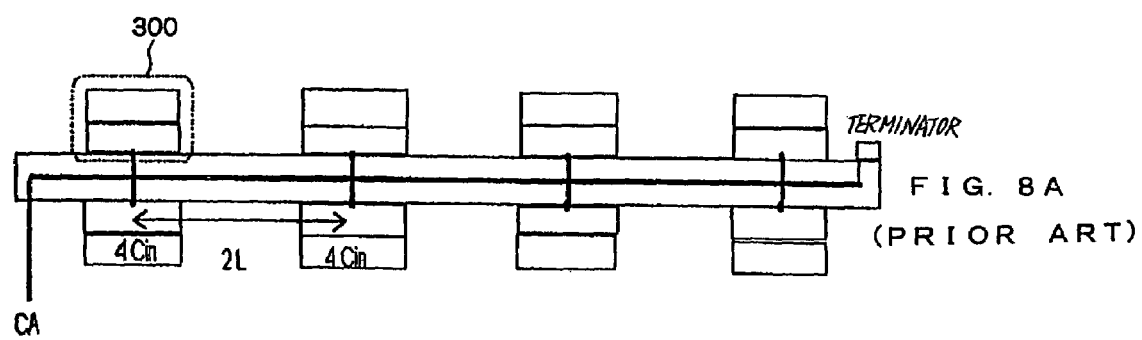
FIG. 8 is a schematic diagram representing a load distribution on the CA signal wiring in the memory module mounted with the stacked memories represented in FIGS. 5A through 5D and FIGS. 6A though 6D.
Figure 9A:
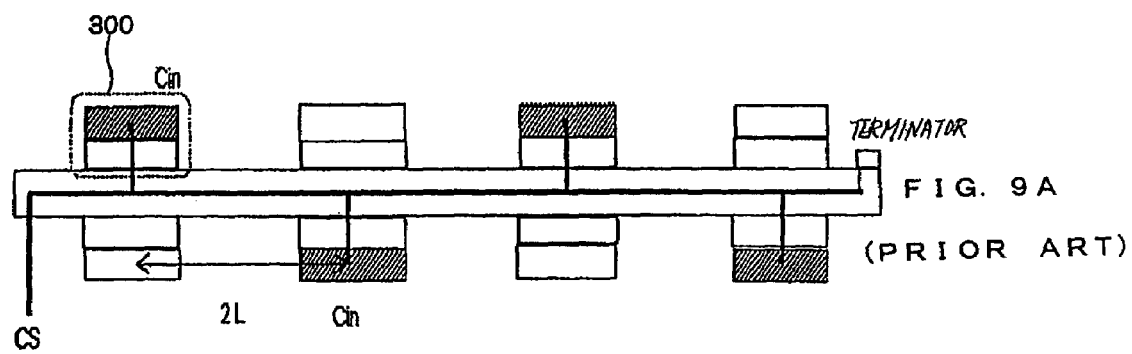
FIG. 9 is a schematic diagram representing a load distribution on the CS signal wiring in the memory module mounted with the stacked memories represented in FIGS. 5A through 5D and FIGS. 6A though 6D.

When above-described stacked memories 300 are mounted on a module substrate, the DQ signal wiring on the memory module is connected to the stacked memories at the wiring ends (FIG. 5B). Further, the CLK signal wiring, the CA signal wiring and the CS signal wiring are connected to stack memories at prescribed spatial intervals. Specifically, the CLK and CA signal wirings are connected to load capacitances each equivalent to four memory chips (cf. FIG. 5C, FIG. 8A) at intervals of two stack memories (2 L), and the CS signal wiring is connected to load capacitances each equivalent to one memory chip (FIG. 5D, FIG. 9A) at intervals of two stack memories (2 L), because the CS signal wiring is connected to a memory chip in a stack memory arranged on one of the front and reverse surfaces of the module substrate.

It is necessary to receive the CA signal and the CS signal at the same timing in a memory module, because these signals are treated correspondingly in a memory module, as described above. The CA signal wiring, however, is connected with load capacitances (cf. FIG. 8A) each equivalent to four memory chips (4 Cin) at intervals of two stack memories (2 L), while the CS signal wiring is connected with load capacitances (cf. FIG. 9A) each equivalent to one memory chips (Cin) at intervals of two stack memories (2 L). Consequently, the transmission characteristics significantly differ between the CA and CS signal wirings making a difference in transmission speeds between the CA and CS signals.

The second embodiment proposes a stack memory intended to solve the above problem.

Figure 6A:
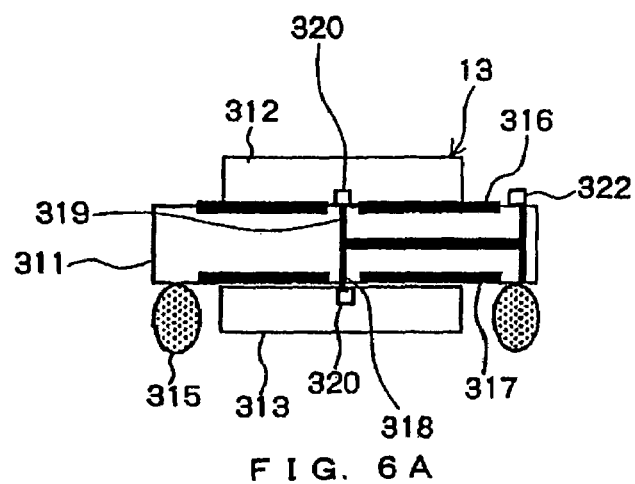
FIG. 6A is a cross-sectional side view illustrating the construction of a stacked memory to be mounted on the memory module of a second embodiment.

Stacked memory 13 employed in the second embodiment is configured such that first memory chip 312 is mounted face down (with chip pad 320 directed downward) on the top surface of package substrate 311 that has ball terminals 315 on the bottom face and second memory chip 313 is mounted face up (with chip pad 320 directed upward) on the bottom surface of package substrate 311, as shown in FIG. 6A.

Figure 6B:
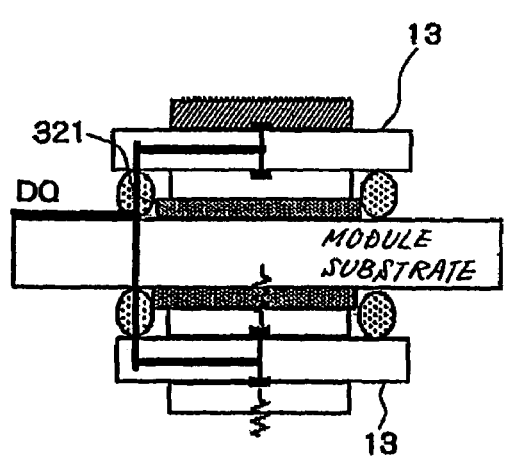
FIG. 6B is a cross-sectional side view illustrating a DQ signal wiring connection between the module substrate and the stacked memory shown in FIG. 6A.
Figure 6C:
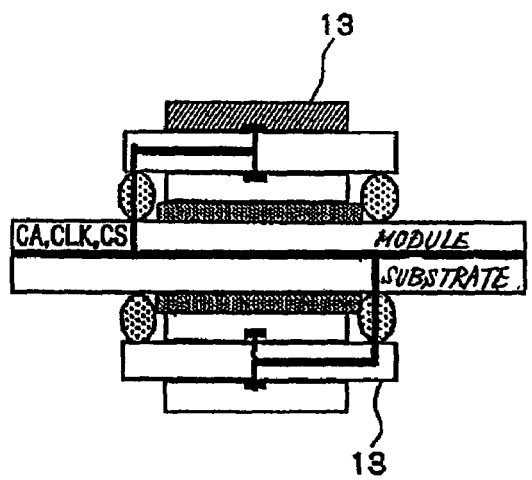
FIG. 6C is a cross-sectional side view illustrating a CA signal wiring connection between a module substrate and a stacked memory shown in FIG. 6A.

Package substrate 311 has, for example, power-supply layer 316 formed on the top surface and GND layer 317 formed on the bottom surface. In addition, signal wiring 318 connected to each of ball terminals 315 is formed in a signal layer within package substrate 311. First and second memory chips 312, 313 and signal wiring 318 are respectively connected through via hole 319 provide in package substrate 311. Stacked memory 13 represented in FIG. 6A is fixed on a module substrate through the use of adhesive 321 (FIGS. 6B, 6C).

Ball terminals (signal terminals) 315 are arranged near the periphery of package substrate 311, and first memory chip 312 and second memory chip 313, both built in stacked memory 13, share signal wiring 318 formed in package substrate 311 and also the signal terminal.

Figures 7A, 7B:
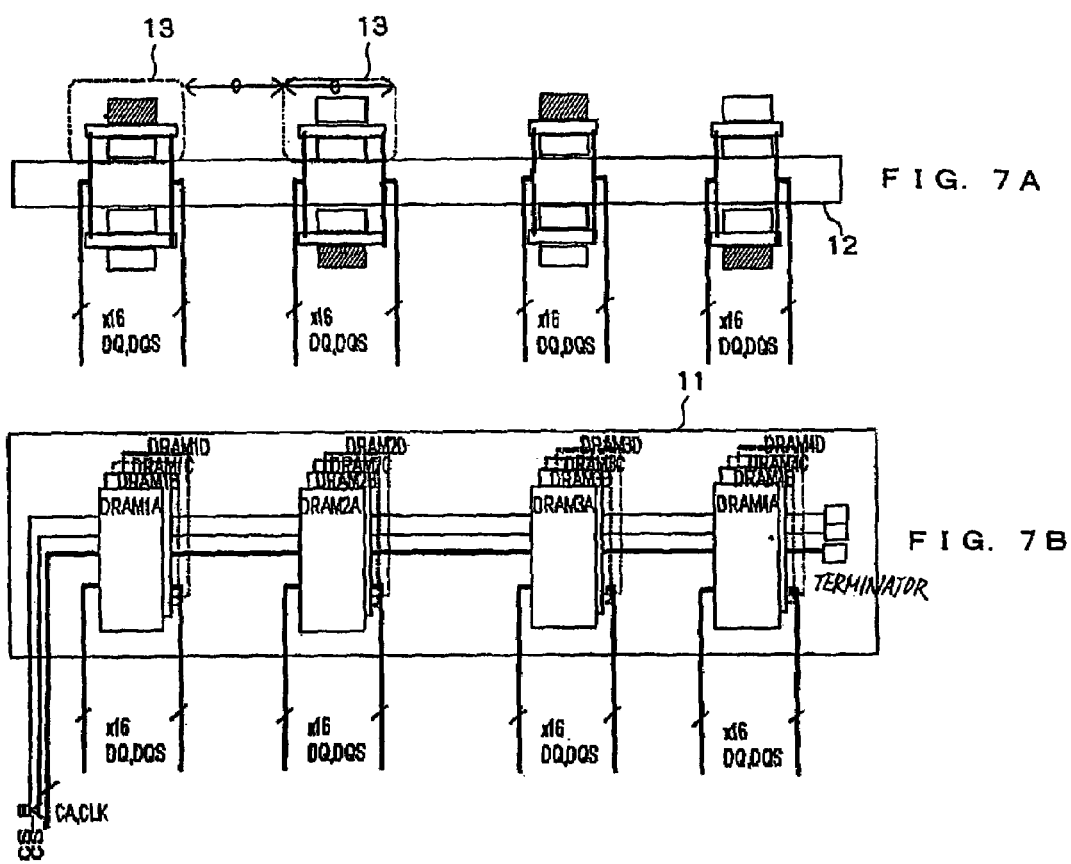
FIG. 7A is a cross-sectional side view illustrating the construction of a second embodiment of the memory module according to the present invention.
FIG. 7B is a plan view illustrating the construction of a second embodiment of the memory module according to the present invention.

As represented in FIGS. 7A and 7B, in memory module 11 of the present embodiment mounted with above stacked memory 13, a 16-bit DQ signal wiring is shared by every stack memory 13 provided with two memory chips, as is the case with the first embodiment. In addition, stack memories 13 are disposed at intervals (O) of one stack memory.

A point-to-point bus is employed for a DQ signal wiring in memory module 11 of the present embodiment, just like a conventional memory module shown in FIG. 1, and the memory controller (not shown) and each stack memory 13 on module substrate 12 are connected through the point-to-point connection. The point-to-point bus is terminated by an ODT (On Die Terminator) provided in each of the two memory chips in each stack memory 13, thereby allowing the reflections of the DQ signal and the DQS signal carried by the point-to-point bus to be prevented. For reference, when the ODT is operated in one or both of memory chips in a stacked memory that includes a memory chip in not activated state, a weak reflection of a signal is caused in stacked memory 13 that includes a memory chip set in an active state (a memory chip shaded by slant lines in FIG. 7A). Accordingly, utilizing this phenomenon enables enhancing an amplitude of the signal.

Daisy chain buses are employed for the CLK and CA signal wirings and the CS signal wiring, just like the conventional memory module shown in FIG. 1. The CLK and CA signal wirings are shared by all the memories in memory module 11 and terminated at the ends of the wirings. The CS signal wiring is shared only by the memory chips within the group (rank) of memory chips to be set in an active state at the same time. Memory module 11 of the present embodiment makes it feasible to reduce the power consumption as compared to the conventional memory module shown in FIG. 1, because the number of memory chips activated at the same time is as small as 4.

The DQ signal wiring on memory module 11 of the present embodiment is connected, at the wiring end, to each of stacked memories 13 arranged on the front and reverse surfaces of the module substrate (FIG. 6B), while the CLK and CA signal wirings and the CS signal wiring are connected, at every connection point provided midway on the respective wirings, to stacked memories 13 on the front and reverse surfaces of the module substrate (cf. FIG. 6C).

Figure 8B:
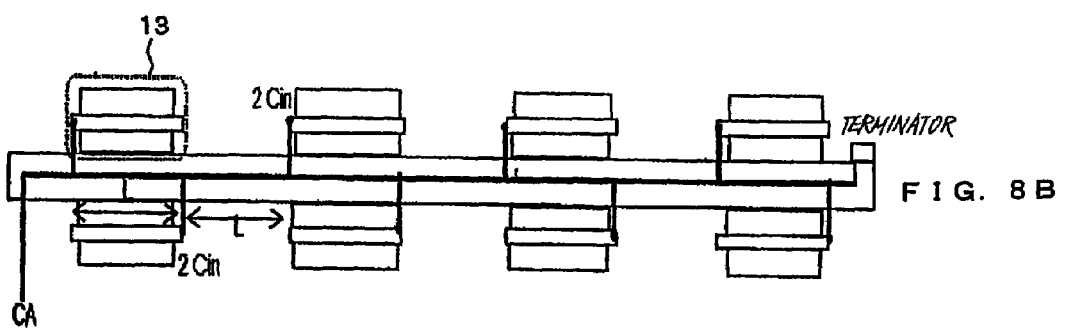

As shown in FIG. 6A, the signal terminal for the CA signal of stacked memory 13 is near the periphery of package substrate 311 (either one of the left and right sides). As a result, there exists an interval equivalent to one stack memory between a signal terminal for the CLK and CA signal wirings of stacked memory 13 and a connection point of the CA signal wiring on module substrate 12. In other words, because the connection point between the daisy chain bus and stacked memory 13 mounted on one surface of module substrate 12 is located in a differing position from the connection point between the daisy chain bus and stacked memory 13 mounted on another surface of module substrate 12, the CLK and CA signal wirings on memory module 11 are connected with the load capacitance each equivalent to two memory chips (2 Cin) at every connection point of eight connection points spaced apart by a distance (L) of one stacked memory, as shown in FIG. 8B.

Accordingly, small load capacitances are distributedly connected to the CLK and CA signal wirings made of daisy chain buses, and consequently the signal wirings become free from any points that cause the characteristic impedance to change abruptly, so that the waveform of a signal carried by the daisy chain bus can be prevented from deterioration.

Figure 9B:
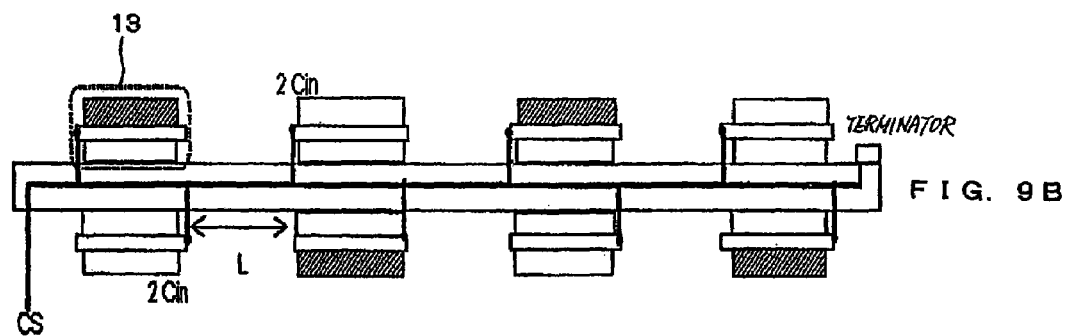

Furthermore, the CS signal wiring is also connected with the load capacitance equivalent to two memory chips (2 Cin) at every connection point of eight connection points spaced apart by a distance (L) of one stacked memory, as shown in FIG. 9B. As a result, the CS signal wiring and the CA signal wiring have similar transmission characteristics without any difference in the signal transmission speeds.

Figure 10:
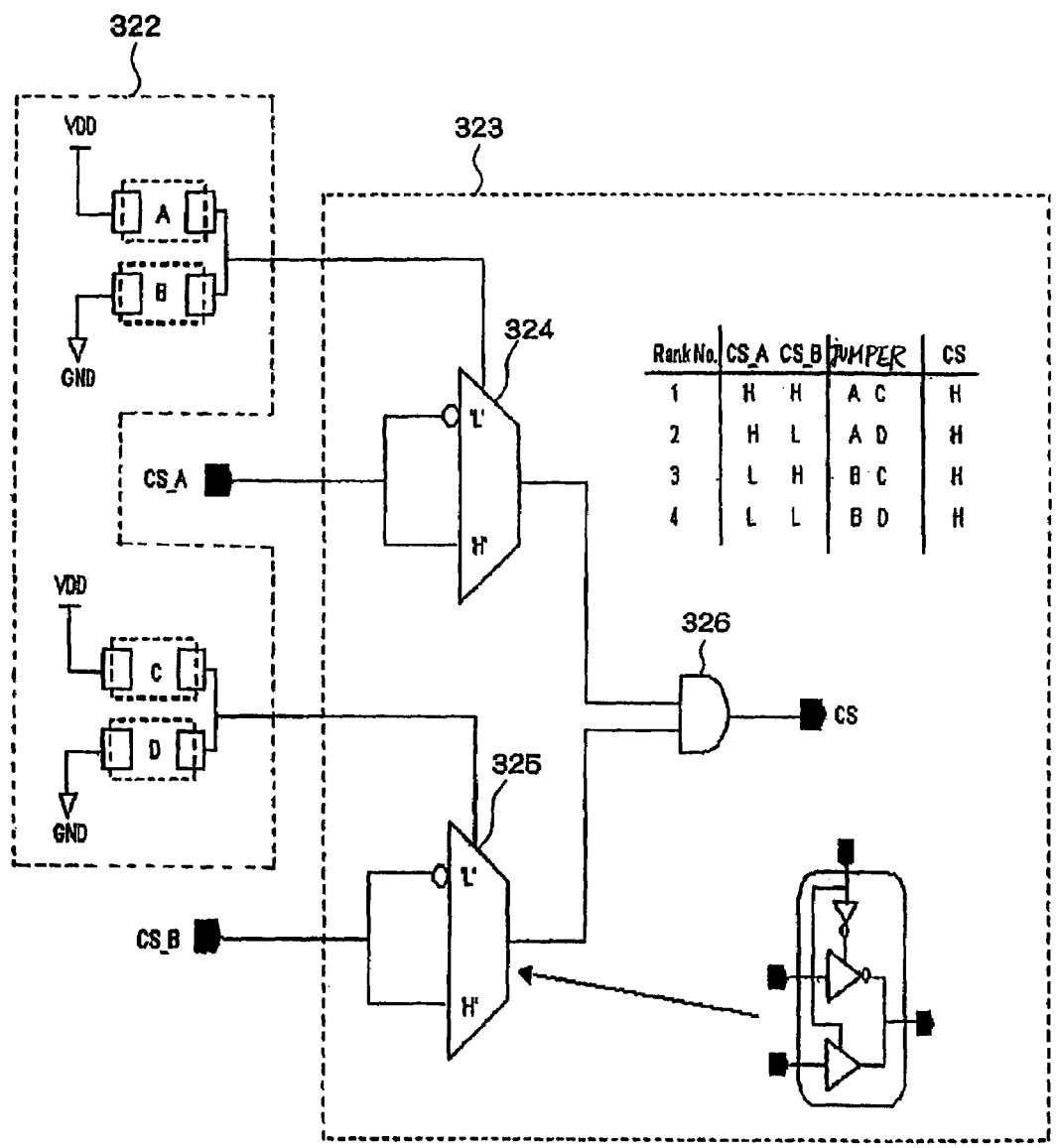
FIG. 10 is a circuit diagram illustrating the circuitry of the jumper chip and decode circuit provided in the stacked memory illustrated in FIG. 6.

Further, in the memory module 11 of the second embodiment mounted with stacked memories 13 illustrated in FIG. 6A, the CS signal wiring is connected with all stacked memories mounted on module substrate 12. Accordingly, in memory module 11 of the second embodiment, the CS signal is provided as 2-bit signal and selects one of four memory chips built in two stacked memories arranged in opposed positions on the front and reverse surfaces of module substrate 12. Specifically, the stacked memory shown in FIG. 6A has code set-up device provided with a jumper chip 322 for setting the memory chip to be selected in accordance with the CS signal represented by the 2-bit code (a combination of high level and low level) and also decode circuit 323 for decoding the CS signal in accordance with the setting result of jumper chip 322. FIG. 10 represents the structures of the jumper chip and decode circuit provided in stacked memory 13 of interest and an example of selecting the memory chips in accordance with the CS signal.

As shown in FIG. 10, stack memory 13 is provided with decode circuit 323 for decoding an externally supplied 2-bit CS signal (CS-A and CS-B).

Decode circuit 323 has a construction having first selector 324, second selector 325 and AND circuit 326 to provide a logical product of the signals supplied from first selector 324 and second selector 325.

First selector 324 receives the CS-A signal and its inversion signal, one of which is selected as an output in accordance with a selection signal. Further, second selector 325 receives the CS-B signal and its inversion signal, one of which is selected as an output in accordance with a selection signal. The outputs of first and second selectors 324, 325 are supplied AND circuit 326, which provides high level if the outputs of both first selector 324 and second selector 325 are high level.

Furthermore, stacked memory 13 is provided with jumper chip 322 for selecting a memory chip according to the CS signal. Jumper chip 322 is configured to have a jumper wiring to shunt one of lines A and B in accordance with an user's option and also have a jumper wiring to shunt one of lines C and D in accordance with an user's option, to provide high level or low level to first selector 324 and second selector 325. For reference, an alternative code set-up device can also be employed: fuses for shunting respective lines A and B and fuses for shunting respective lines C and D are employed, and high level or low level is provided to first selector 324 and second selector by fusing one of the fuses for shunting respective lines A and B and also fusing one of the fuses for shunting respective lines C and D.

In jumper chip 322 shown in FIG. 10, if line A is selected (shunted), then the selection signal to be supplied to first selector 324 becomes high level, and alternatively if line B is selected, then the selection signal to be supplied to first selector 324 becomes low level. In addition, if line C is selected, then the selection signal to be supplied to first selector 325 becomes high level, and alternatively if line D is selected, then the selection signal to be supplied to first selector 325 becomes low level.

It is through the provision of above-described jumper chip 322 that the selection signals of first and second selectors 324, 325 are decided and also the codes of the CS-A signal and the CS-B signal which activate memory chips (which supply high level of the CS signals) are decided.

In the case of the circuitry shown in FIG. 10, if lines A, C are selected, then CS-A=H (high level) and CS-B=H yield CS=H; if lines A, D are selected, then CS-A=H and CS-B=L (low level) yield CS=H; if lines B, C are selected, then CS-A=L and CS-B=H yield CS=H; and if lines B, D are selected, then CS-A=L and CS-B=L yield CS=H. Memory chips are selected on a rank-by-rank basis in accordance with the CS signal by allotting these four combinations uniquely to respective ranks.

Third Embodiment

As shown in FIG. 11, stacked memory 23 of a third embodiment is configured such that four memories 402 each provided with through holes 408 are mounted on package substrate (interposer) 401 having ball terminals (signal terminals) 405 for electrically connecting with the module substrate. A technology of stacking a plurality of memory chips on a interposer 401 as described above is called CoC (Chip-on-Chip), wherein each memory chip 402 and ball terminal 405 are electrically connected through via through holes 408 bored through memory chips 402 and signal wirings formed in interposer 401.

For reference, the CoC technology is explained in detail, for example, Y. Akiyama et al., "Superfine Pitch Ultrasonic Bonding Technology on 3D Stacked LSI", ICEP (International Conferences of Electronics Packaging) Proceedings, pp. 326–331, 2003., or K. Takahashi et al., "Current Status of Research and Development for 3D Chip Stack Technology" Jpn. J. Appl. Phys., Vol. 40(4B), pp. 3032, 2001 etc.

Figures 12A, 12B:
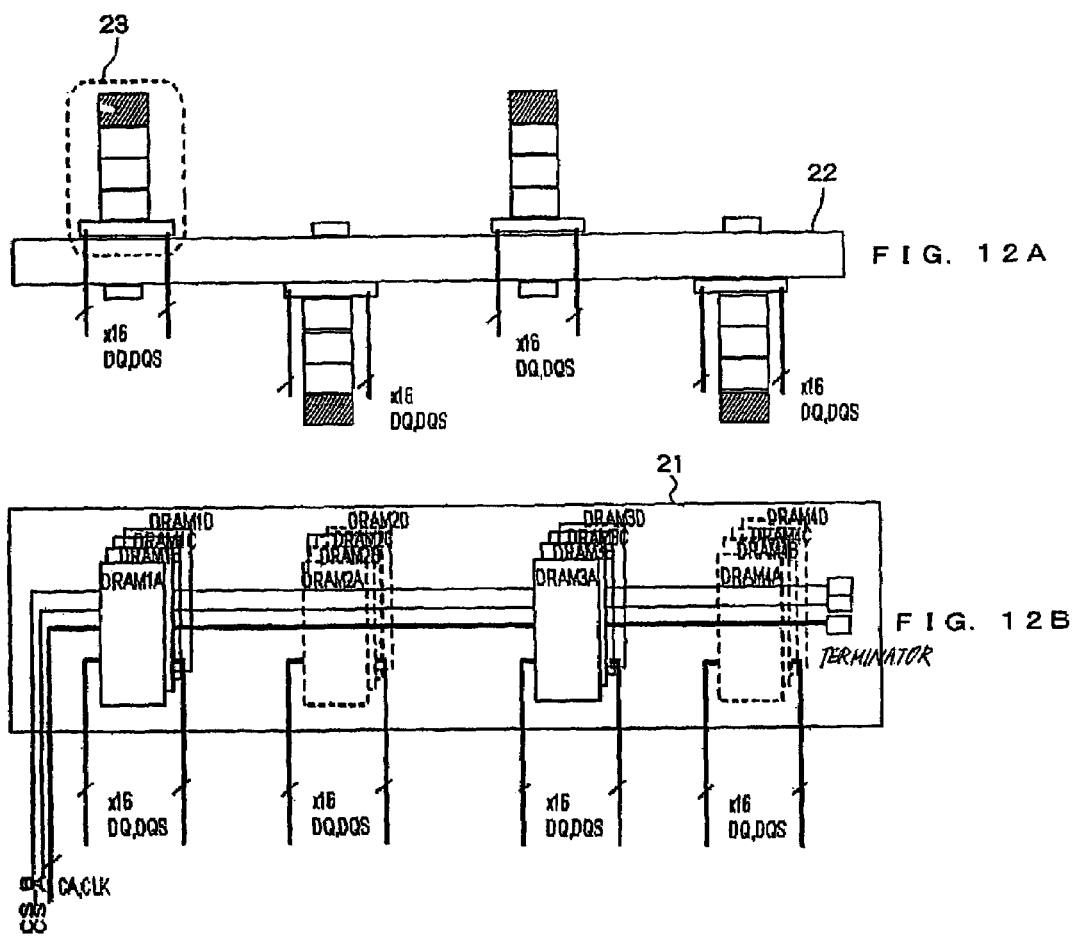
FIG. 12A is a cross-sectional side view illustrating the construction of a third embodiment of the memory module according to the present invention.
FIG. 12B is a plan view illustrating the construction of a third embodiment of the memory module according to the present invention.

As shown in FIG. 12A and 12B, each of stacked memory 23 having four memory chips shares a 16-bit DQ signal wiring in memory module 21 of the present embodiment. Further, stacked memories 23 are arranged at intervals of two stacked memories.

A point-to-point bus is employed for the DQ signal wiring of memory module 21 as a case with a conventional memory module represented in FIG. 1, and the memory controller (not shown) and each stacked memory 23 on memory module 22 are electrically connected via point-to-point connections. The point-to-point bus is terminated by an ODT (On Die Terminator) provided in each of the four memory chips in each stacked memory 23, whereby the reflections of the DQ and DQS signals carried by the point-to-point buses are prevented.

Furthermore, daisy chain buses are employed for the CA and CLK signal wirings as a case with a conventional memory module represented in FIG. 1, and a CA signal wiring is shared by all the memory chips in memory module 21 with the wiring end terminated. A CS signal wiring is shared only by the group of the memory chips to be set in an active state at the same time (rank). The power consumption of the memory module of the present embodiment is reduces as compared to the conventional memory module illustrated in FIG. 1, because the number of the memory chips to be activated at the same time is four.

Memory module 21 mounted with the stacked memories shown in FIG. 11 has a CA signal wiring to which load capacitances each equivalent to four memory chips are connected at intervals of two stacked memories. As a result, degradation in a signal waveform could occur due to local variations of the characteristic impedance of the transmission line.

Figure 13:
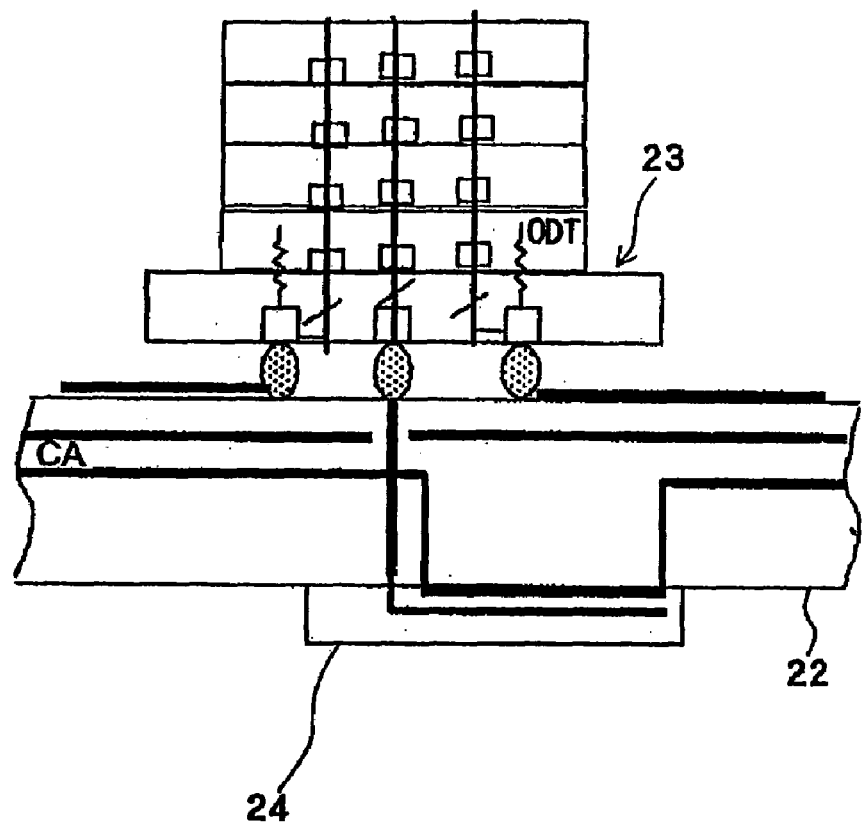
FIG. 13 is a cross-sectional side view illustrating an example of connection between the stacked memory and the CA signal wiring in the memory module shown in FIG. 11.

From this point of view, the CA signal wiring (daisy chain bus) formed within module substrate 22 and the CA signal terminal of stacked memory 23 are connected through directional coupler 24 as shown in FIG. 13, whereby the daisy chain bus is connected to the load capacitance not through a "point-like" junction but through a distributed configuration that extends "line-wise." Consequently, the local variation in the characteristic impedance of the CA signal wiring is mitigated, whereby the degradation of a signal waveform is obviated. In this regard, however, because a differential waveform of the CA signal is supplied from directional coupler 24, it is required to provide, in stacked memory 23, a comparator for detecting the differential waveform delivered from directional coupler 24.

Figure 14A:
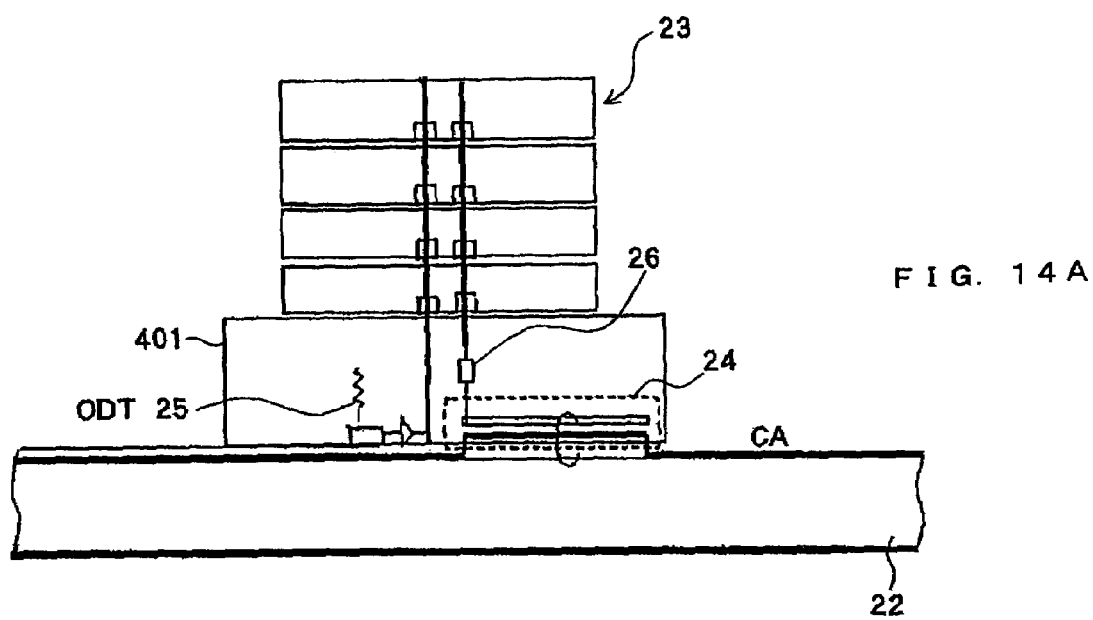
FIG. 14 is a cross-sectional view illustrating an alternative construction of a stacked memory to be mounted on the memory module of the third embodiment according to the present invention.
Figure 14B:
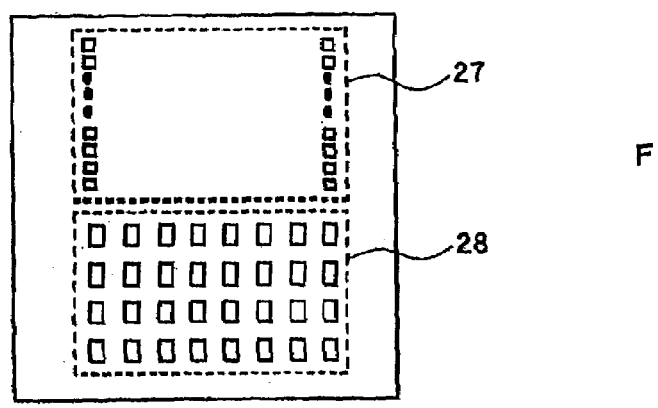

Stacked memory 23 shown in FIG. 14A is a configuration example in which interface circuits, such as ODT 25 for terminating a DQ signal wiring, directional coupler 24, comparator 26, etc., are provided in package substrate (interposer) 401. In the above configuration, it is not required to install any interface circuit within module substrate 22 or a memory chip, because the interface circuits are built in interposer 401. Furthermore, in stacked memory 23 shown in FIG. 14, pads are provided for connecting the stacked memory 23 and module substrate 22 on the contact face between the stacked memory 23 and module substrate 22, wherein these pads are arranged separately for CA signal terminal region 27 and DQ signal terminal region 28 (cf. FIG. 14B).

In this embodiment, if above directional coupler 24 is used to connect the CA signal wiring and stacked memory 23, it is required to provide two signal terminals for one CA signal on interposer 23 of stacked memory 23. In addition, it is necessary to arrange paired CA signal terminals apart by the length of directional coupler 24 in order to minimize the length of the CA signal wiring. This causes a layout area of the CA signal terminals to increase, entailing an increase in the size of interposer 401 and resulting in difficulty in downsizing stacked memory 23.

Figure 15A:
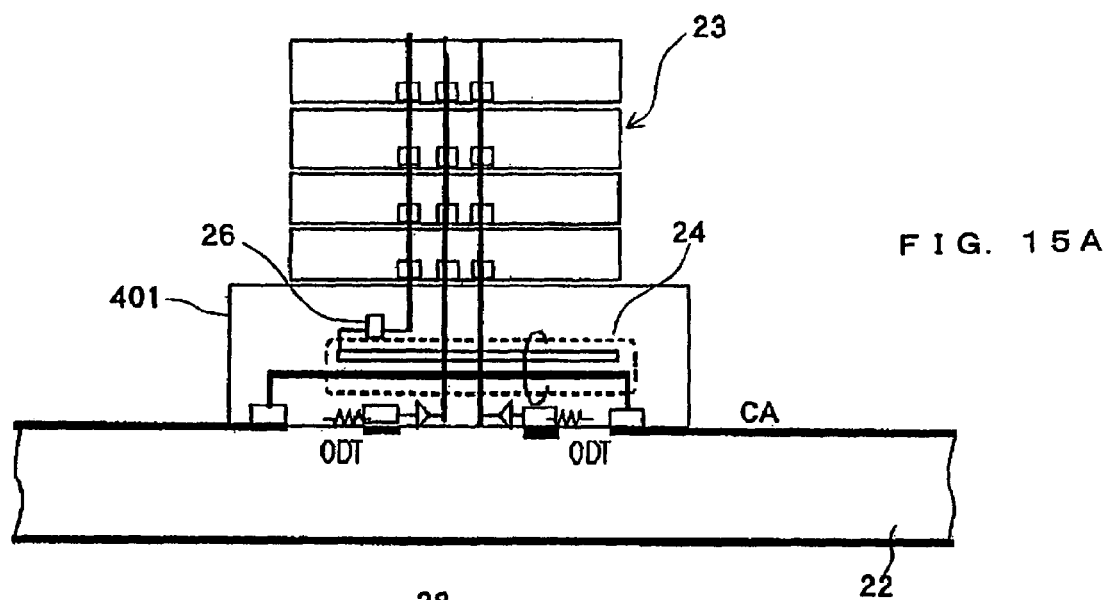
FIG. 15 is a cross-sectional view illustrating another construction of a stacked memory to be mounted on the memory module of the third embodiment according to the present invention.
Figure 15B:
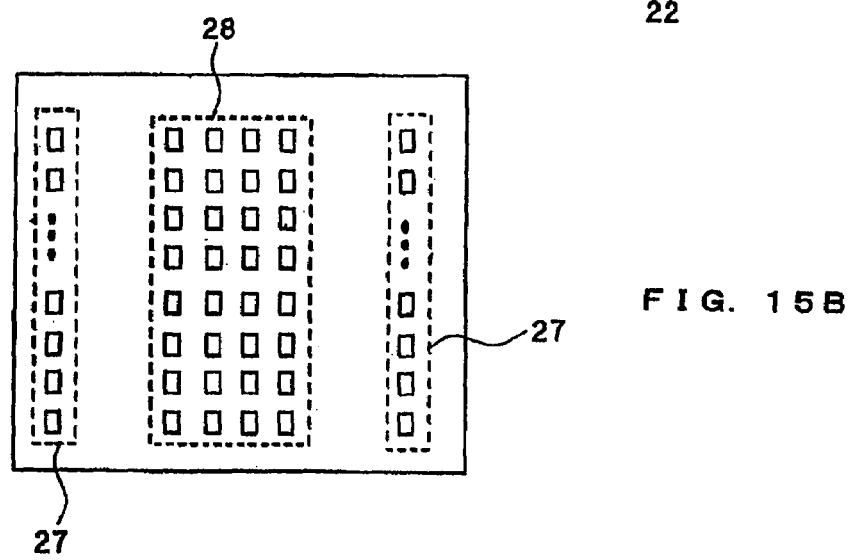
Figure 16A:
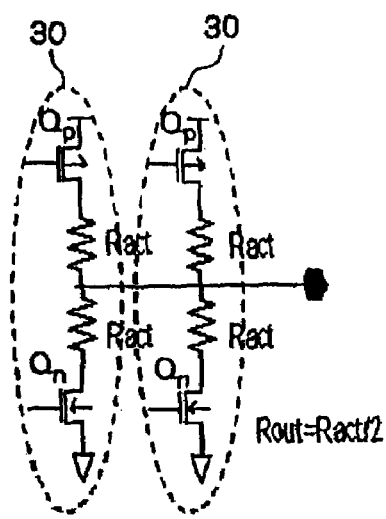
FIG. 16A is a circuit diagram representing the configuration of a driver-terminator circuit at the time of data output employed in the stacked memory mounted on the memory module of the fourth embodiment according to the present invention.
Figure 16B:
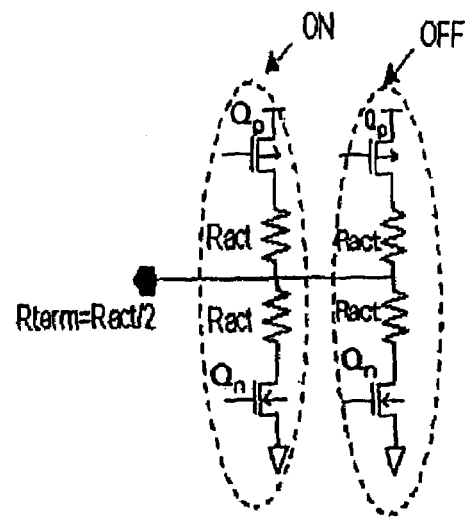
FIG. 16B is a circuit diagram representing the configuration of a driver-terminator circuit at the time of the CTT termination employed in the stacked memory mounted on the memory module of the fourth embodiment according to the present invention.
Figure 16C:
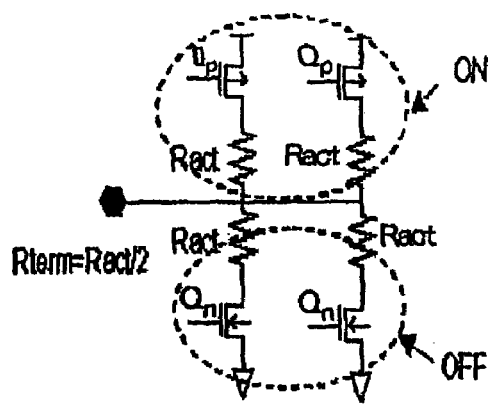
FIG. 16C is a circuit diagram representing the configuration of a driver-terminator circuit at the time of the VDDQ termination employed in the stacked memory mounted on the memory module of the fourth embodiment according to the present invention.
Figure 16D:
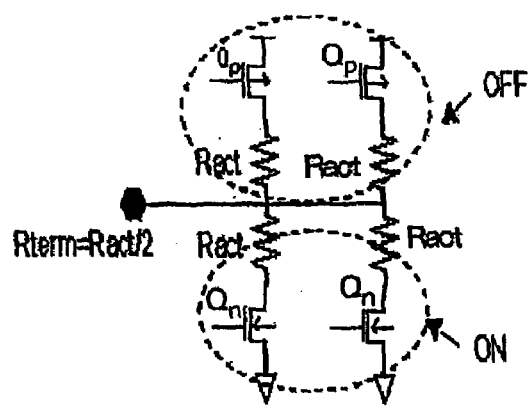
FIG. 16D is a circuit diagram representing the configuration of a driver-terminator circuit at the time of the GND termination employed in the stacked memory mounted on the memory module of the fourth embodiment according to the present invention.

In view of the above problem, the components other than the CA signal terminals, such as the DQ signal terminals etc., are arranged between paired CA signal terminals provided in interposer 401 of stack memory 23, as shown in FIG. 15A. The arrangement of signal terminals as described above makes it possible to avoid upsizing of interposer 401, thereby realizing downsizing of stacked memory 23. In this embodiment, the pads of the CA signal terminal regions are arranged on the contact face between interposer 401 and module substrate 22 in such a manner that the pads of DQ signal terminal region 28 are interposed between the CA signal terminal regions 27 (cf. FIG. 15B).

Fourth Embodiment

Because the DQ signal terminal of a stacked memory is ordinarily employed in common for a data input and a data output. For this reason, a driver circuit for providing an output of data is commonly connected with the DQ signal terminal. The driver circuit is typically constructed making use of a MOS transistor and consequently the capacitance of the drain diffusion layer of the MOS transistor is connected to the point-to-point bus as a capacitive load. The capacitive load due to the driver circuit is larger than the input capacitance of CA signal terminals of the memory chip. Accordingly, it follows that in a memory module of the 4-rank configuration, capacitive loads equivalent to four memory chips are connected to the DQ signal wiring, causing potential difficulty in a high speed transmission of the DQ signal.

In a fourth embodiment, a memory module is configured such that the stacked memory to be mounted on the memory module is provided with a driver-terminator circuit that serves as both a driver circuit for providing a data output and a terminator circuit for terminating a wiring end when receiving data, as shown in FIGS. 16A through 16D.

The driver-terminator circuit employed in the present embodiment has a configuration having two driver circuits 30 connected in parallel, as shown in FIGS. 16A through 16D.

Driver circuit 30 is configured such that a resistor and a PMOS transistor Qp are connected in series between a DQ signal terminal and the power supply and a resistor and an NMOS transistor Qn are connected in series between a DQ signal terminal and the ground potential.

Defining the output resistance of this driver circuit 30 as Rout yields output resistance of Rout/2 for two driver circuits 30, because the two driver circuits are employed when providing a data output.

The driver-terminator circuit of the present invention serves as a terminator circuit when receiving a data input, wherein, in the case of the CTT (Center Tapped Termination) configuration, PMOS transistor Qp and NMOS transistor Qn in the first stage driver circuit 30 are each turned on, and PMOS transistor Qp and NMOS transistor Qn in the second stage driver circuit 30 are each turned off. In this mode of operation, the termination resistance Rterm is Rout/2.

Further, when the driver-terminator circuit is employed in the VDDQ termination configuration at the time of a data input, PMOS transistor Qp in the first stage driver circuit 30 and PMOS transistor Qp in the second stage driver circuit 30 are each turned on and NMOS transistor Qn in the first stage driver circuit 30 and NMOS transistor Qn in the second stage driver circuit 30 are each turned off. In this mode of operation, the termination resistance Rterm is Rout/2.

Furthermore, when the driver-terminator circuit is employed in the GND termination configuration at the time of a data input, PMOS transistor Qp in the first stage driver circuit 30 and PMOS transistor Qp in the second stage driver circuit 30 are each turned off and NMOS transistor Qn in the first stage driver circuit 30 and NMOS transistor Qn in the second stage driver circuit 30 are each turned on. In this mode of operation, the termination resistance Rterm is Rout/2, i.e., both of the output resistance at the time of a data output and the termination resistance at the time of a data input become equal.

In this case, presuming that the value of each resistance connected in series with PMOS transistor Qp and NMOS transistor Qn is Ract and also that the ON resistances of both PMOS transistor Qp and NMOS transistor Qn equal Ron yields an amplitude of the drain voltage in each MOS transistor equal to the voltage amplitude at the DQ signal terminal multiplied by Ron/(Ract+Ron).

Figure 17:
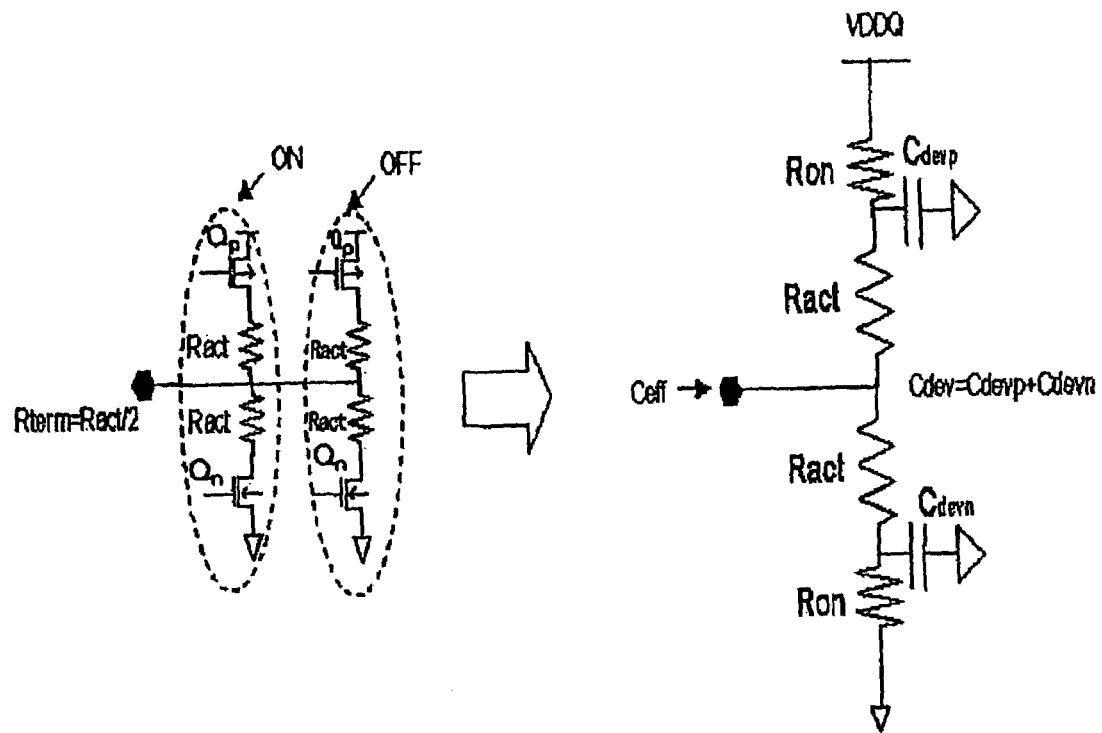
FIG. 17 is a circuit diagram representing a equivalent circuit of the driver-terminator circuit illustrated in FIGS. 16A through 16D at the time of the CTT termination.

As a result, an apparent load capacitance Ceff at the DQ signal terminal is reduced to the diffusion-layer capacitance of the drain of MOS transistor Cdev multiplied by Ron/(Ract+Ron) (cf. FIG. 17). Accordingly, if the value of the resistor Ract is set to the value larger than the ON resistances Ron of PMOS transistor Qp and NMOS transistor Qn, then it becomes feasible to reduce the apparent load capacitance Ceff at the DQ signal terminal. Consequently, it is enabled even for a memory module in a 4-rank configuration to realize high-speed transmission of the DQ signal by making use of the driver-terminator circuit shown in FIGS. 16A through 16D as an ODT of a stacked memory.

Fifth Embodiment

Figure 18A:
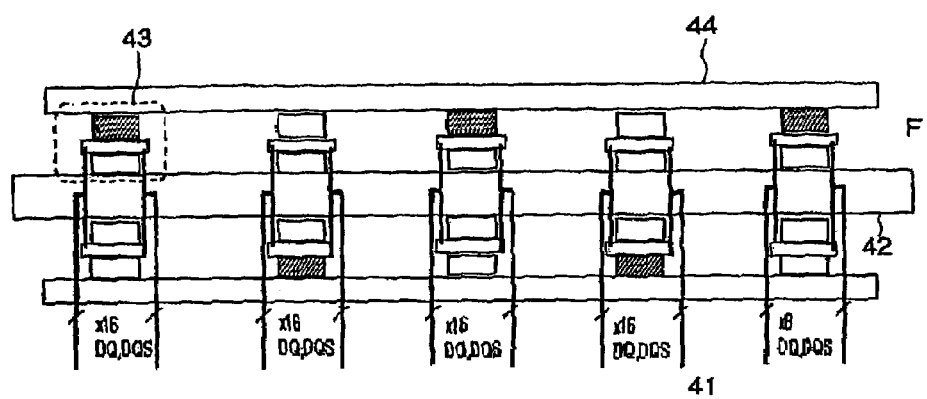
FIG. 18A is a cross-sectional side view illustrating a fifth embodiment of the memory module according to the present invention.
Figure 18B:
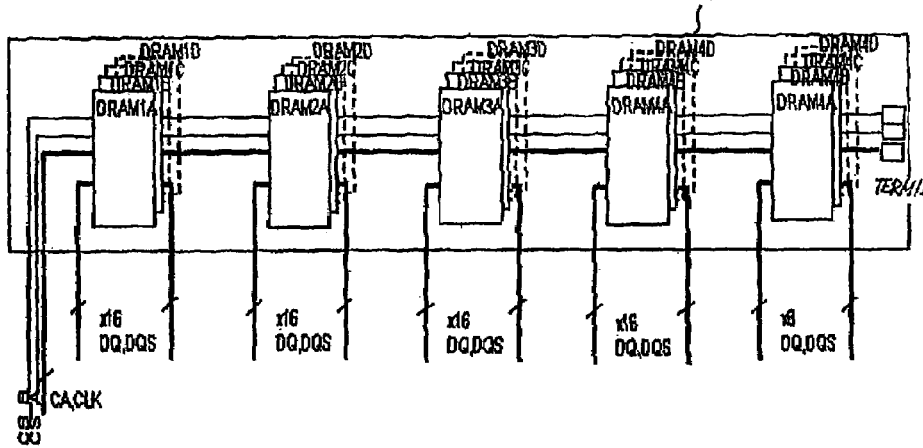
FIG. 18B is a plan view illustrating a fifth embodiment of the memory module according to the present invention.

As shown in FIG. 18A through 18B, memory module 41 of a fifth embodiment is configured to add two stacked memories 43 mounted with 8-bit I/O memory chips to the 64-bit I/O memory module shown in FIG. 6A and 6B thereby creating capability for 72-bit I/O and further provide heat spreaders 44 over respective stacked memories mounted on the front and reverse surfaces of module substrate 42.

In the memory module 41 of the fifth embodiment, it is intended to activate at the same time the two memory chips on one surface and three memory chips on another surface of module substrate 42 and not to activate at the same time the memory chips in neighboring stacked memories 43. The other constituents are the same as those of the memory modules in the first and second embodiments and thus the explanation is omitted.

In memory module 41 of the present embodiment, because the heat generated when memory chips operate is dispersed by heat spreader 44, the efficiency of heat dissipation is improved and the temperature rise in the memory chips is mitigated, thereby suppressing the degradation of the memory characteristics. For reference, the configuration of the present embodiment is applicable to a 72-bit I/O memory module in the 4-rank configuration as well.

Sixth Embodiment

A sixth embodiment is a configuration example of a memory system mounted with memory modules 51 in two slots, respectively, as illustrated in FIG. 19.

Memory module 51 shown in FIG. 19 is a 36-bit I/O memory module mounted with eight 8-bit I/O stacked memories and two 4-bit I/O stacked memories (twenty memory chips (DRAM) in all). The other constituents of the memory module are the same as those in the first through fifth embodiments, and thus the explanation is omitted. For reference, the number of memory modules 51 to be mounted is not limited to two and can be any number equal to or more than one.

The memory system of the present embodiment is constructed such that memory controller 52 is connected independently to respective memory modules 51 thereby enabling simultaneous accesses to a plurality of memory modules 51 from a CPU etc. through memory controller 52. Adopting the above-described construction enables easy construction of a memory system, for example, in a 72-bit I/O, two-slot, and four-rank configuration.

Seventh Embodiment

Figure 20A:
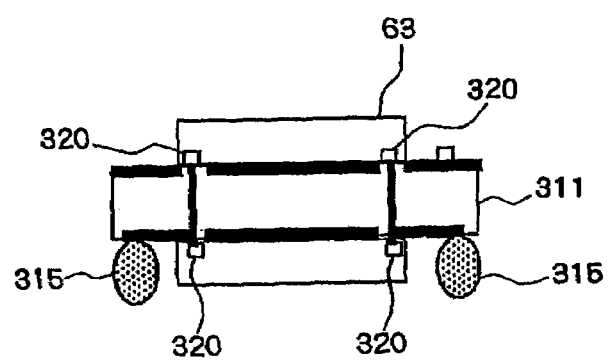
FIG. 20A is a cross-sectional view illustrating a construction of a stacked memory to be mounted on the memory module of the seventh embodiment according to the present invention.
Figure 20B:
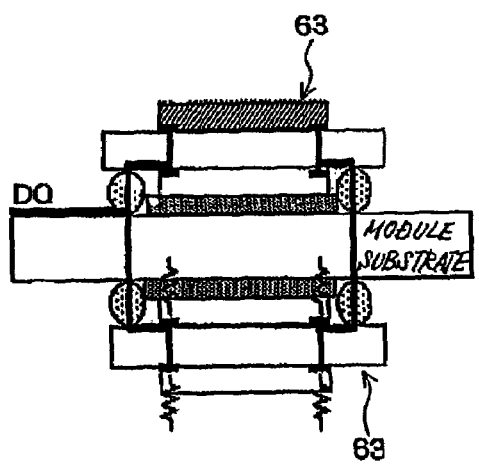
FIG. 20B is a cross-sectional side view illustrating a DQ signal wiring connection between the module substrate and the stacked memory shown in FIG. 20A.

FIG. 20A is a cross-sectional side view representing a configuration of a stacked memory to be mounted on the memory module of the seventh embodiment according to the present invention; FIG. 20B is a cross-sectional side view representing the connections between the module substrate and the stacked memories illustrated in FIG. 20A through DQ signal wirings; and FIG. 20C is a cross-sectional side view representing the connections between the module substrate and the stacked memories illustrated in FIG. 20A through CA signal wirings.

Stacked memory 63 represented in FIG. 20A has a configuration such that ball terminals (signal terminals) 315 for connecting stacked memory 63 to the module substrate are arranged near the periphery (or both ends) of package substrate 311 and chip pads 320 of memory chips mounted on package substrate 311 are also arranged near the periphery (or both ends) of package substrate 311. The other constituents are the same as those of the stacked memory described in the second embodiment, and thus the explanation is omitted.

Figure 20C:
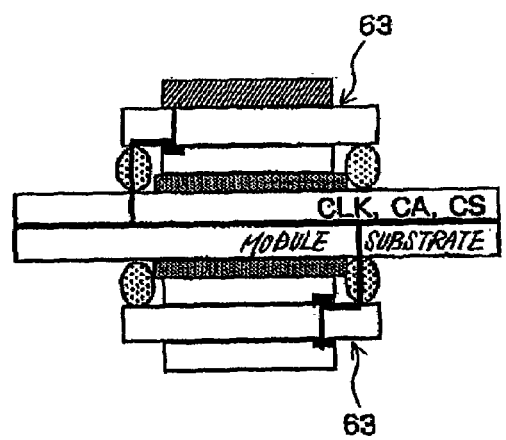
FIG. 20C is a cross-sectional side view illustrating a CA signal wiring connection between the module substrate and the stacked memory shown in FIG. 20A

The arrangement of providing memory chips having chip pads 320 arranged near the periphery and also providing ball terminals 315 arranged near the periphery of package substrate 311, just like stacked memory 63 of the present embodiment, allows minimizing the lengths of signal wirings formed in package substrate 311 as represented in FIG. 20B and 20C. Thus, the wiring capacitance of stacked memory 63 is reduced, whereby the load capacitances connected to the DQ signal wirings, the CA signal wirings, etc. are reducible.

While preferred embodiments of the present invention have been described using specific terms, such description is for illustrative purposes only, and it is to be understood that changes and variations may be made without departing from the spirit or scope of the following claims.

What is claimed is:

1. A stacked memory comprising:
    a package substrate having signal terminals arranged near the periphery thereof, and
    a plurality of memory chips that are mounted on both surfaces of said package substrate and share said signal terminals; and
    a wiring in said package substrate that connects said signal terminals to said plurality of memory chips, wherein said wiring has a substantially equal length between at least one of said signal terminals and a pair of said plurality of memory chips.

2. The stacked memory according to claim 1, wherein at least one of said plurality of memory chips has chip pads arranged near the periphery thereof to connect to said wirings formed in said package substrate.

3. The stacked memory according to claim 1, further comprising a code set-up device for setting in an active state, one of the plurality of memory chips in accordance with a code of an externally supplied chip select signal of a plurality of bits.

4. The stacked memory according to claim 3, wherein said code set-up device comprises:
    a jumper chip on which a jumper wiring is mountable for supplying a power-supply voltage or a ground potential, and
    a decode circuit for decoding said chip select signal in accordance with an output potential of said jumper chip and supplying a decoded result to each of said plurality of memory chips.

5. A stacked memory comprising:
    a package substrate having signal terminals arranged near the periphery thereof, and
    a plurality of memory chips that are mounted on both surfaces of said package substrate and share said signal terminals
    a code set-up device for setting in an active state, at least one of said plurality of memory chips in accordance with a code of an externally supplied chip select signal of a plurality of bits,
    wherein said code set-up device comprises:
        a jumper chip on which a fuse for supplying a power-supply voltage or a ground potential is mounted in a fusible arrangement, and
        a decode circuit for decoding said chip select signal in accordance with an output potential of said jumper chip and supplying a decoded result to at least one of said plurality of memory chips.

6. A stacked memory comprising:
    a plurality of memory chips provided with through holes for wiring, and
    a package substrate on which said plurality of memory chips are stacked on one surface thereof, and provided with a directional coupler that supplies a signal to said plurality of memory chips from signal terminals shared by said plurality of memory chips.

7. The stacked memory according to claim 6, further provided with a signal terminal for supplying another signal arranged between two said signal terminals connected to said directional coupler.

8. The stacked memory according to claim 6, wherein said memory chip is provided with a driver-terminator circuit that serves as both a driver circuit for providing a data output and a terminator circuit for terminating a wiring end when receiving data.

9. A memory module comprising:
    stacked memories according to claim 6, and
    a module substrate provided with a point-to-point bus and a daisy chain bus for carry signals to said stacked memories, wherein said stacked memories are mounted on each of both surfaces of said module substrate spaced apart by a distance equivalent to a length of at least one stacked memory.

10. The memory module according to claim 9, configured in a four-rank configuration in which four memory chips are set in an active state at the same time.

11. The memory module according to claim 9, wherein a connection point that connects said daisy chain bus and a stacked memory mounted on one surface of said module substrate and the connection point that connects said daisy chain bus and a stacked memory mounted on another surface of said module substrate are different points.

12. A memory system, comprising:
    memory modules each according to claim 9,
    slots in which said memory modules are to be installed, and a memory controller that is connected independently to said memory modules and enables simultaneous access to a plurality of said memory modules.

13. A stacked memory comprising:
a package substrate having signal terminals arranged near a periphery thereof; and
a plurality of memory chips that are mounted on both surfaces of said package substrate and share said signal terminals,
wherein at least one of said plurality of memory chips is provided with a driver-terminator circuit that serves as both a driver circuit for providing a data output and a terminator circuit for terminating a wiring end when receiving data.

14. A memory module comprising:
stacked memories comprising:
a package substrate having signal terminals arranged near the periphery thereof, and
a plurality of memory chips that are mounted on both surfaces of said package substrate and share said signal terminals; and
a module substrate provided with a point-to-point bus and a daisy chain bus for carry signals to said stacked memories, wherein said stacked memories are mounted on each of the front and reverse surfaces spaced apart by a distance equivalent to a length of at least one stacked memory.

15. The memory module according to claim 14, wherein each wiring of a chip select signal for setting said plurality of memory chips in an active state is connected to said stacked memories such that said plurality of memory chips provided in the stacked memories mounted on one surface are selected at the same time alternately with said plurality of memory chips provided in the stacked memories mounted on another surface of said module substrate.

16. The memory module according to claim 14, configured in a four-rank configuration in which four memory chips are set in an active state at the same time.

17. The memory module according to claim 14, wherein a connection point that connects said daisy chain bus and a stacked memory mounted on one surface of said module substrate and a connection point that connects said daisy chain bus and a stacked memory mounted on another surface of said module substrate are different points.

18. A memory system, comprising:
memory modules each according to claim 14,
slots in which said memory modules are to be installed, and
a memory controller that is connected independently to said memory modules and enables simultaneous access to a plurality of said memory modules.

19. A memory module comprising:
stacked memories comprising:
a package substrate having signal terminals arranged near the periphery thereof,
a plurality of memory chips that are mounted on both surfaces of said package substrate and share said signal terminals, and
a code set-up device for setting in an active state, at least one of said plurality of memory chips in accordance with a code of an externally supplied chip select signal of a plurality of bits; and
a module substrate provided with a point-to-point bus and a daisy chain bus for carrying signals to said stacked memories, wherein said stacked memories are mounted on each of the front and reverse surfaces spaced apart by a distance equivalent to a length of at least one stacked memory.

20. The memory module according to claim 19, wherein a chip select signal for setting said plurality of memory chips in an active state is supplied to each of stacked memories such that said plurality of memory chips provided in the stacked memories mounted on one surface of said module substrate are selected at the same time alternately with said plurality of memory chips provided in the stacked memories mounted on another surface of said module substrate.

21. The memory module according to claim 19, configured in a four-rank configuration in which four memory chips are set in an active state at the same time.

22. The memory module according to claim 19, wherein a connection point that connects said daisy chain bus and a stacked memory mounted on one surface of said module substrate and the connection point that connects said daisy chain bus and a stacked memory mounted on another surface of said module substrate are different points.

23. A memory system, comprising:
memory modules each according to claim 19,
slots in which said memory modules are to be installed, and
a memory controller that is connected independently to said memory modules and enables simultaneous access to a plurality of said memory modules.

24. A memory module comprising:
stacked memories each having: a plurality of memory chips provided with through holes for wiring; and
a package substrate on which said plurality of memory chips are stacked on one surface thereof and provided with a plurality of signal terminals for supplying signals to said stacked memories; and
a module substrate provided with a point-to-point bus and a daisy chain bus for carrying signals to said stacked memories,
wherein said stacked memories are mounted on each of both surfaces of said module substrate spaced apart by a distance equivalent to the length of at least one stacked memory, and also provided with a directional coupler for coupling said daisy chain bus and the signal terminals of said stacked memories.

25. The memory module according to claim 24, configured in a four-rank configuration in which four memory chips are set in an active state at the same time.

26. The memory module according to claim 24, wherein a connection point that connects said daisy chain bus and a stacked memory mounted on one surface of said module substrate and the connection point that connects said daisy chain bus and a stacked memory mounted on another surface of said module substrate are different points.

27. A memory system, comprising:
memory modules each according to claim 24,
slots in which said memory modules are to be installed, and
a memory controller that is connected independently to said memory modules and enables simultaneous access to a plurality of said memory modules.

* * * * *